United States Patent
Na et al.

(10) Patent No.: US 11,574,942 B2
(45) Date of Patent: Feb. 7, 2023

(54) SEMICONDUCTOR DEVICE WITH LOW DARK NOISE

(71) Applicant: Artilux, Inc., Menlo Park, CA (US)

(72) Inventors: Yun-Chung Na, Hsinchu County (TW); Yen-Cheng Lu, Hsinchu County (TW); Ming-Jay Yang, Hsinchu County (TW); Szu-Lin Cheng, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 70 days.

(21) Appl. No.: 16/709,848

(22) Filed: Dec. 10, 2019

(65) Prior Publication Data

US 2020/0194480 A1 Jun. 18, 2020

Related U.S. Application Data

(60) Provisional application No. 62/878,322, filed on Jul. 24, 2019, provisional application No. 62/865,305, filed on Jun. 24, 2019, provisional application No. 62/849,978, filed on May 20, 2019, provisional application No. 62/778,867, filed on Dec. 12, 2018.

(51) Int. Cl.
*H01L 27/146* (2006.01)
*H01L 29/167* (2006.01)

(52) U.S. Cl.
CPC .. *H01L 27/14616* (2013.01); *H01L 27/14665* (2013.01); *H01L 29/167* (2013.01)

(58) Field of Classification Search
CPC ......... H01L 27/14616; H01L 27/14665; H01L 29/167; H01L 27/14612; H01L 31/0224; H01L 31/103; H01L 27/14605; H01L 27/1461; H01L 31/035272; H01L 31/03529; H01L 31/0288; H01L 27/146; H01L 27/148; G01S 17/10; G01S 7/4861
See application file for complete search history.

(56) References Cited

U.S. PATENT DOCUMENTS

| 3,621,466 A | 11/1971 | Toshio |
| 4,341,918 A | 7/1982 | Evans, Jr. et al. |
| 5,453,611 A | 9/1995 | Oozu |

(Continued)

FOREIGN PATENT DOCUMENTS

| CN | 1853276 | 10/2006 |
| CN | 104617119 | 5/2015 |

(Continued)

OTHER PUBLICATIONS

Bamji et al., "A 0.13 μm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.

(Continued)

*Primary Examiner* — Selim U Ahmed
(74) *Attorney, Agent, or Firm* — Fish & Richardson P.C.

(57) ABSTRACT

A semiconductor device includes a germanium region, a doped region in the germanium region, wherein the doped region is of a first conductivity type; and a counter-doped region in the germanium region and adjacent to the doped region, wherein the counter-doped region is of a second conductivity type different from the first conductivity type.

7 Claims, 19 Drawing Sheets

(56) References Cited

U.S. PATENT DOCUMENTS

| | | |
|---|---|---|
| 5,673,284 A | 9/1997 | Congdon et al. |
| 5,965,875 A | 10/1999 | Merrill |
| 6,509,203 B2 | 1/2003 | Spartiotis et al. |
| 7,090,133 B2 | 8/2006 | Zhu |
| 7,411,265 B2 | 8/2008 | Sekiguchi |
| 7,629,661 B2 | 12/2009 | Rafferty et al. |
| 7,750,958 B1 | 7/2010 | Dierickx |
| 7,826,058 B1 | 11/2010 | Ulrich et al. |
| 7,884,310 B2 | 2/2011 | Buettgen |
| 7,961,301 B2 | 6/2011 | Earhart et al. |
| 8,129,813 B2 | 3/2012 | Herz |
| 8,405,823 B2 | 3/2013 | Pfaff |
| 9,236,520 B2 | 1/2016 | Okhonin |
| 10,254,389 B2 | 4/2019 | Na |
| 10,310,060 B2 | 6/2019 | Na et al. |
| 10,353,056 B2 | 7/2019 | Na et al. |
| 10,418,407 B2 | 9/2019 | Na |
| 10,613,202 B2 | 4/2020 | Roy et al. |
| 10,690,495 B2 | 6/2020 | Takagi et al. |
| 10,739,443 B2 | 8/2020 | Na et al. |
| 10,741,598 B2 | 8/2020 | Na et al. |
| 10,795,003 B2 | 10/2020 | Na et al. |
| 10,886,309 B2 | 1/2021 | Na et al. |
| 10,886,312 B2 | 1/2021 | Na et al. |
| 11,131,757 B2 | 9/2021 | Na et al. |
| 2003/0042500 A1 | 3/2003 | Rhodes et al. |
| 2005/0051730 A1 | 3/2005 | Kuijk et al. |
| 2005/0167709 A1 | 8/2005 | Augusto |
| 2007/0164767 A1 | 7/2007 | Herz |
| 2008/0303058 A1 | 12/2008 | Mori et al. |
| 2009/0166684 A1 | 7/2009 | Yahav et al. |
| 2009/0237770 A1 | 9/2009 | Kim et al. |
| 2011/0031578 A1 | 2/2011 | Miura et al. |
| 2011/0128430 A1 | 6/2011 | Fossum |
| 2011/0255071 A1 | 10/2011 | Van Der Tempel et al. |
| 2012/0001234 A1 | 1/2012 | Lim et al. |
| 2012/0307232 A1 | 12/2012 | Mase |
| 2013/0026548 A1 | 1/2013 | McCarten |
| 2013/0119234 A1 | 5/2013 | Lee et al. |
| 2013/0214161 A1 | 8/2013 | Cazuax et al. |
| 2013/0322752 A1* | 12/2013 | Lim .................. G06T 5/002 382/167 |
| 2014/0002700 A1 | 1/2014 | Oishi |
| 2014/0111664 A1 | 4/2014 | Kumano |
| 2014/0117428 A1 | 5/2014 | Lee et al. |
| 2014/0225173 A1 | 8/2014 | Kim et al. |
| 2014/0312206 A1 | 10/2014 | Okhonin et al. |
| 2014/0367740 A1 | 12/2014 | Morse |
| 2015/0001664 A1 | 1/2015 | Van Der Tempel et al. |
| 2015/0060951 A1* | 3/2015 | Hynecek ........... H01L 27/14614 257/228 |
| 2015/0187923 A1 | 7/2015 | Kawahito |
| 2016/0056315 A1 | 2/2016 | Shibata et al. |
| 2016/0141329 A1 | 5/2016 | Cheng et al. |
| 2016/0150174 A1 | 5/2016 | Hynecek |
| 2016/0155883 A1 | 6/2016 | Shi et al. |
| 2016/0161599 A1 | 6/2016 | Seliuchenko |
| 2016/0225922 A1 | 8/2016 | Akkaya et al. |
| 2016/0316159 A1 | 10/2016 | Yoneda |
| 2017/0040361 A1 | 2/2017 | Ikeda et al. |
| 2017/0040362 A1 | 2/2017 | Na et al. |
| 2017/0074643 A1 | 3/2017 | Chang |
| 2017/0131389 A1 | 5/2017 | Na et al. |
| 2018/0175095 A1 | 6/2018 | Sallin et al. |
| 2018/0190698 A1 | 7/2018 | Na |
| 2018/0190702 A1* | 7/2018 | Na ..................... H01L 31/1037 |
| 2018/0247968 A1* | 8/2018 | Na ..................... H01L 27/14634 |
| 2019/0302243 A1 | 10/2019 | Na et al. |
| 2019/0319139 A1 | 10/2019 | Cho et al. |
| 2019/0348463 A1 | 11/2019 | Na et al. |
| 2020/0052016 A1 | 2/2020 | Na et al. |
| 2020/0249327 A1 | 8/2020 | Na et al. |
| 2021/0126027 A1 | 4/2021 | Na et al. |
| 2021/0302549 A1 | 9/2021 | Na et al. |
| 2022/0262835 A1 | 8/2022 | Chen et al. |
| 2022/0262974 A1 | 8/2022 | Lu et al. |

FOREIGN PATENT DOCUMENTS

| | | |
|---|---|---|
| EP | 2081004 | 7/2009 |
| EP | 2330637 | 6/2011 |
| JP | H0548139 | 2/1993 |
| JP | 2009-047658 | 3/2009 |
| JP | 2011-66097 | 3/2011 |
| JP | 2011-128024 | 6/2011 |
| WO | WO 2005/036647 | 4/2005 |
| WO | WO 2013/104718 | 7/2013 |
| WO | WO 2015/104307 | 7/2015 |
| WO | WO 2016/038416 | 3/2016 |
| WO | WO 2016/077791 | 5/2016 |
| WO | WO 2016/208215 | 12/2016 |
| WO | WO 2017/018477 | 2/2017 |
| WO | WO 2018/191539 | 10/2018 |
| WO | 2019165220 A1 | 8/2019 |
| WO | 2019199691 A1 | 10/2019 |

OTHER PUBLICATIONS

Bianco et al., "A Comparative Analysis between Active and Passive Techniques for Underwater 3D Reconstruction of Close-Range Objects," Sensors, Aug. 20, 2013, 13(8): 11007-11031.

Chen et al., "Self-Aligned Microbonded Germanium Metal-Semiconductor-Metal Photodetectors Butt-Coupled to Si Waveguides," IEEE J. Sel. Top. Quant. Electron. Nov. 2014. 20(6):3800605, 5 pages.

Dalla Bella et al., "Design and Characterization of Current-Assisted Photonic Demodulators in 0.18-μm CMOS Technology," IEEE Trans. Electron. Dev., Jun. 2011, 58(6):1702-1709.

EP Extended European Search Report in European Application No. 168630325, dated Aug. 23, 2018, 5 pages.

EP Extended European Search Report in European Application No. 181760315, dated Aug. 27, 2018, 6 pages.

EP Extended European Search Report in European Application No. 18761724.6-1211, dated Feb. 27, 2020, 6 pages.

EP Extended European Search Report in European Application No. 18781691.3, dated Jan. 27, 2020, 5 pages.

EP Extended European Search Report in European Application No. 21182787.8, dated Aug. 19, 2021, 5 pages.

Fang et al., "An Integration PIN/MISS OEIC for High Current Photoreceiver Applications," IEEE Transactions on Electron Devices, Jan. 1997, 44(1):34-38.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Fossum el al., "A Review of the Pinned Photodiode for CCD and CMOS Image Sensors," IEEE J. Electron Devices Soc. May 1, 2014, 2(3):33-43.

Geng, "Structured-light 3D surface imaging: a tutorial," Advances in Optics and Photonics, Jun. 30, 2011, 3(2):128-160.

Gulden et al., "Novel optical distance sensor based on MSM technology." IEEE Sensors Journal. Oct. 2004, 4(5):612-8.

Hutchinson et al., "High-Resolution Aliasing-Free Optical Beam Steering," Optica, vol. 3, No. 8, dated Aug. 5, 2016, 4 pages.

Joo et al., "High-sensitivity 10 Gbps Ge-on-Si photoreceiver operating at λ~1.55 μm," Optics Express, Aug. 2, 2010, 18(16):16474-16479.

Kato et al., "320×240 Back-Illuminated 10-μm CAPD Pixels for High-Speed Modulation Time-of-Flight CMOS Image Sensor," IEEE J. Solid-State Circuits Apr. 2018, 53(4):1071-1078.

Kawahito et al., "A CMOS Time-of-Flight Range Image Sensor With Gates-on-Field-Oxide Structure," IEEE Sensors J. Dec. 2007, 7(12):1578-1586.

Kim et al., "A Three-Dimensional Time-of-Flight CMOS Image Sensor Willi Pinned-Photodiode Pixel Structure," IEEE Electron. Dev. Lett., Nov. 2010, 31(11):1272-1274.

(56) References Cited

OTHER PUBLICATIONS

Koester et al., "Ge-on-SOI-Detector/Si-CMOS-Amplifier Receivers for High-Performance Optical-Communication Applications," J. Lightw. Technol., Jan. 2001, 25(1):46-57.
Lange et al., "Solid-State Time-of-Flight Range Camera," IEEE J. Quant. Electron. Mar. 2001, 37(3):390-397.
Li et al., "High-Bandwidth and High-Responsivity Top-Illuminated Germanium Photodiodes for Optical Interconnection," IEEE Trans. Electron Dev., Mar. 2013, 60(3):1183-1187.
Lischke et al., "High bandwidth, high responsivity waveguide-coupled germanium p-i-n photodiode," Optics Express, Oct. 19, 2015, 23(21):27213-27220.
Liu et al., "Backside-incidence critically coupled Ge on SOI photodetector," Proc. SPIE 10100, Optical Components and Materials, Feb. 16, 2017, XIV, 101001X, 6 pages.
Michel et al., "High-performance Ge-on-Si photodetectors," Nature Photon. Jul. 30, 2010, 4:527-534.
Morse et al., "Performance of Ge-on-Si p-i-n Photodetectors for Standard Receiver Modules," IEEE Photon. Technol. Lett., Dec. 1, 2006, 18(23):2442-2444.
Office Action in Japanese Appln. No. 2019-555177, dated Sep. 13, 2021, 5 pages (with translation).
PCT International Preliminary Report on Patentability in International Application No. PCT/US2016/060493, dated May 8, 2018, 11 pages.
PCT International Preliminary Report on Patentability in International Application No. PCT/US2018/025949, dated Oct. 8, 2019, 7 pages.
PCT International Preliminary Report on Patentability in International Appln. No. PCT/US2018/020262, dated Sep. 3, 2019, 11 pages.
PCT International Search Report and Written Opinion in International Application No. PCT/US2016/060493, dated Jan. 10, 2017, 20 pages.
PCT International Search Report and Written Opinion in International Application No. PCT/US2018/020262, dated Jun. 6, 2018, 14 pages.
PCT International Search Report and Written Opinion in International Application No. PCT/US2018/025949, dated Jul. 10, 2018, 14 pages.
Perenzoni et al., "Compact SPAD-Based Pixel Architectures for Time-Resolved Image Sensors," Sensors, May 23, 2016, 16(5):745, 12 pages.
Place et al., "Rad tolerant CMOS image sensor based on hole collection 4T pixel pinned photodiode." IEEE Transactions on Nuclear Science. Dec. 6, 2012, 59(6):2888-93.
Rafferty et a., "Monolithic germanium SWIR imaging array," 2008 IEEE Conference on Technologies for Homeland Security, Waltham, MA, May 12, 2008, p. 577-582.
Ringbeck et al., "Multidimensional measurement by using 3-D PMD sensors," Adv. Radio Sci., Jan. 1, 2007, 5:135-146.
Tseng et al., "High-performance silicon-on-insulator grating coupler with completely vertical emission," Sep. 21, 2015, 23(19):24433-9.
Tseng et al., "A self-assembled microbonded germanium/silicon heterojunction photodiode for 25 GB/s high-speed optical interconnects," Sci. Rep. Nov. 15, 2013, 3:3225, 6 pages.
Van Der Tempel et al., "Lock-in Pixel Using a Current-Assisted Photonic Demodulator Implemented in 0.6 µm Standard Complementary Metal-Oxide-Semiconductor," Jpn. J. Appl. Phys., Apr. 24, 2017 46(4B):2377-2380.
Van Nieuwenhove et al., "Photonic Demodulator With Sensitivity Control," IEEE Sensors J. Mar. 2007, 7(3):317-318.
Wu et al., "A critically coupled Germanium photodetector under vertical illumination," Opt. Express, Dec. 31, 2012, 20(28):29338-29346.
Yin et al., "31GHz Ge n-i-p waveguide photodetectors on Silicon-on-Insulator substrate," Optics Express Oct. 17, 2007, 15(21):13965-13971.
Yokogawa et al., "IR sensitivity enhancement of CMOS Image Sensor with diffractive light trapping pixels," Sci. Rep. Jun. 19, 2017, 7(1):38232, 9 pages.
EP Extended European Search Report in European Appln. No. 19215416, dated May 18, 2020, 7 pages.

\* cited by examiner

SEMICONDUCTOR DEVICE WITH LOW DARK NOISE

CROSS REFERENCE TO RELATED APPLICATIONS

This patent application claims the benefit of U.S. Provisional Patent Application No. 62/778,867, filed on Dec. 12, 2018, U.S. Provisional Patent Application No. 62/849,978, filed on May 20, 2019, U.S. Provisional Patent Application No. 62/878,322, filed Jul. 24, 2019, and U.S. Provisional Patent Application No. 62/865,305, filed on Jun. 24, 2019, which are incorporated by reference herein in their entireties.

BACKGROUND OF THE INVENTION

1. Field of the Invention

The present invention relates generally to a semiconductor device, and more specifically to doped regions of a semiconductor device.

2. Description of the Prior Art

Signal-to-noise ratio (SNR) is an index to evaluate the performance of semiconductor devices, such as a photodetector. The signal power is related to the parameter "photo current", which describes an electron flow generated by the irreversible absorption of photons by a material under a non-equilibrium condition. The noise power is related to the parameter "dark current", which describes an electron flow generated by the thermal excitation of electrons in a material under a non-equilibrium condition.

SUMMARY OF THE INVENTION

According to an aspect of the present application, a semiconductor device is provided. The semiconductor device includes a germanium region; a doped region in the germanium region, wherein the doped region is of a first conductivity type; and a counter-doped region in the germanium region and adjacent to the doped region, wherein the counter-doped region is of a second conductivity type different from the first conductivity type.

In a further aspect of the present application, a photo-detecting device is provided. The photo-detecting device includes an absorption layer including germanium; a first doped region in the germanium region, wherein the first doped region is of a first conductivity type; a second doped region in the germanium region and physically separated from the first doped region, wherein the second doped region is of a second conductivity type the same as the first conductivity type; a first counter-doped region in the germanium region and adjacent to the first doped region, wherein the first counter-doped region is of a third conductivity type different from the first conductivity type; and a second counter-doped region in the germanium region and adjacent to the second doped region, wherein the second counter-doped region is of a fourth conductivity type the same as the third conductivity type.

In a further aspect of the present application, a photo-detecting device is provided. The photo-detecting device includes an absorption layer including germanium; a first carrier collection region in the germanium region, wherein first carrier collection region is of a first conductivity type; and a first dark-current reduction region in the absorption layer and adjacent to the first carrier collection region, wherein the first counter-doped region is of a second conductivity type different from the first conductivity type.

In a further aspect of the present application, a photo-detecting device is provided. The photo-detecting device includes an absorption layer including germanium, wherein the absorption layer is of a conductivity type; a first doped region in the absorption layer, wherein the first doped region is of a first conductivity type different from the conductivity type of the absorption layer; and a second doped region in the absorption layer and physically separated from the first doped region, wherein the second doped region is of a second conductivity type different from the first conductivity type; wherein the absorption layer includes a dopant including a peak doping concentration not less than $1 \times 10^{15}$ cm$^{-3}$.

In a further aspect of the present application, a photo-detecting system is provided. The photo-detecting system includes a dark-carrier emission time and a carrier relaxation time. The photo-detecting system includes a photo-detecting device including an absorption layer; a means for adjusting the carrier relaxation time, wherein the means is electrically coupled to the photo-detecting device. The carrier relaxation time is greater than the dark-carrier emission time $t_{emission}$.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
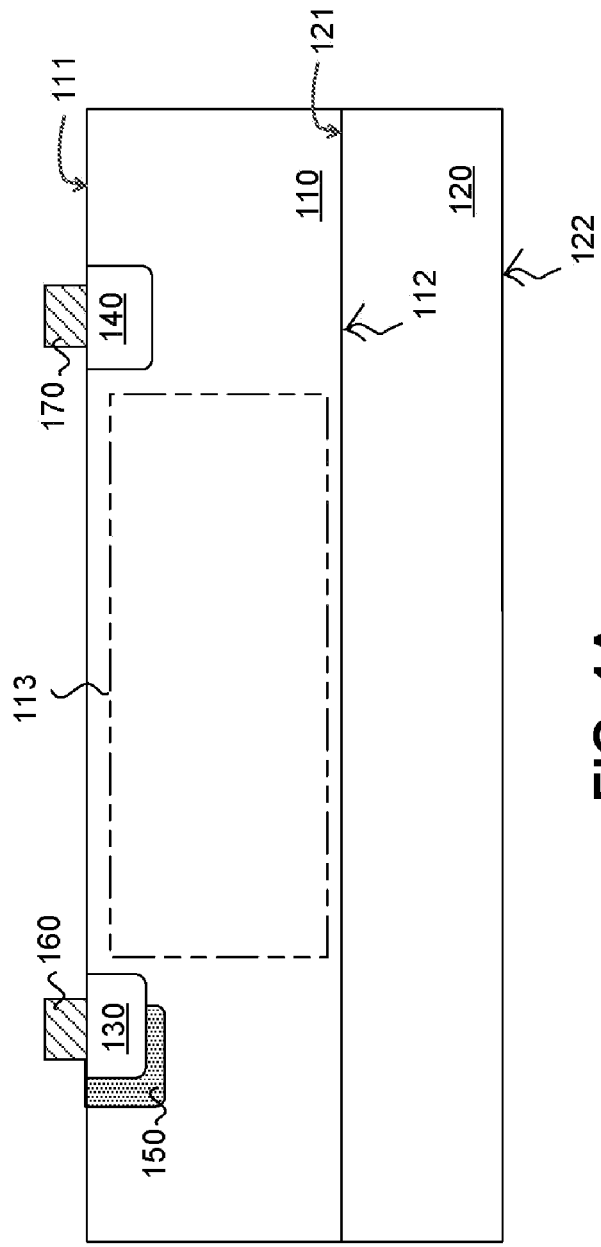
FIG. 1A illustrates a cross-sectional view of a semiconductor device, according to some embodiments.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precisely scaled and components may be exaggerated in view of width, height, length, etc. Herein, the similar or identical reference numerals will denote the similar or identical components throughout the drawings.

In the present disclosure, a photo-detecting device is capable of converting an optical signal to an electrical signal. The term "germanium-silicon (GeSi)" refers to a $Ge_xSi_{1-x}$, wherein 0<x<1. The term "intrinsic" refers to a semiconductor material without intentionally adding dopants.

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

FIG. 1A illustrates a cross-sectional view of a semiconductor device, according to some embodiments. In some embodiments, the semiconductor device is a photo-detecting device. The photo-detecting device is capable of converting an optical signal to an electrical signal. The photo-detecting device includes an absorption layer 110 and a substrate 120 supporting the absorption layer 110. The photo-detecting device further includes a first doped region 130, a second doped region 140 separated from the first doped region 130, and a counter-doped region 150 adjacent to the first doped region 130. The first doped region 130 is a carrier collection region to collect one type of photo-carriers generated from the absorption layer 110, such as collecting electrons or collecting holes. The second doped region 140 is also a carrier collection region to collect another type of photo-carriers generated from the absorption layer 110, for example, if the first doped region 130 collects electrons, the second doped region 140 collects holes. The first doped region 130 and the second doped region 140 are in the absorption layer 110. The first doped region 130, the second doped region 140 and the counter-doped region 150 can be formed by any suitable method such as implanting suitable dopants in the absorption layer 110. In some embodiments, the absorption layer 110 includes a top surface 111 and a bottom surface 112 opposite to the top surface 111. In some embodiments, the absorption layer 110 further includes a detection region 113 for receiving optical signal. In some embodiments, the photo-detecting device may include a light shield (not shown) having a window for defining the position of the detection region 113. In other words, the window is for allowing the incident optical signal enter into the absorption layer 110 and defining the detection region 113. In some embodiments, the light shield is on the second surface 122 of the substrate 120 when an incident light enters the absorption layer 110 from the second surface 122 of the substrate 120. In some embodiments, a shape of the window can be ellipse, circle, rectangular, square, rhombus, octagon or any other suitable shape from a top view of the window. In some embodiments, the detection region 113 is between the first doped region 130 and the second doped region 140.

In some embodiments, the photo-detecting device may include an optical element for changing the direction of an optical signal to allow the optical signal enter into the absorption layer 110 and thus define the detection region 113. For example, the optical element may converge the optical signal. The optical element includes, but is not limited to, lens.

The first doped region 130 and the second doped region 140 are beneath the top surface 111. In some embodiments, the counter-doped region 150 surrounds a portion of the first doped region 130 father from the second doped region 140, and the other portion of the first doped region 130 is not surrounded by the counter-doped region 150. In some embodiments, the counter-doped region 150 entirely surrounds the first doped region 130. In some embodiments, the first doped region 130 is of a first conductivity type. The second doped region 140 is of a second conductivity type different from the first conductivity type. The counter-doped region 150 is of a third conductivity type different from the first conductivity type. In some embodiments, the absorption layer 110 is intrinsic. In some embodiments, if the photo-detecting device is configured to process the collected electrons for further application, the first doped region 130 is of n-type, the second doped region 140 is of p-type, the counter-doped region 150 is of p-type, and the absorption layer 110 is intrinsic. The counter-doped region 150 serves as a dark-current reduction region for reducing the dark current of the photo-detecting device.

Referring to FIG. 1A, in some embodiments, the photo-detecting device further includes a first contact layer 160 and a second contact layer 170. The first contact layer 160 is electrically connected to the first doped region 130. The second contact layer 170 is electrically connected to the second doped region 140. In some embodiments, the first contact layer 160 and the second contact layer 170 include metals or alloys. For example, the first contact layer 160 and the second contact layer 170 include Al, Cu, W, Ti, Ta—TaN—Cu stack or Ti—TiN—W stack. In some embodiments, the first contact layer 160 and the second contact layer 170 include metal silicide or metal germanide. Metal Silicide includes, but is not limited to nick silicide. The detection region 113 of the absorption layer 110 is between the first contact layer 160 and the second contact layer 170.

Referring to FIG. 1A, the absorption layer 110 is configured to absorb photons and to generate photo-carriers from the absorbed photons. In some embodiments, the absorption layer 110 is configured to absorb photons having a peak wavelength in an invisible wavelength range not less than 800 nm, such as 850 nm, 940 nm, 1050 nm, 1064 nm, 1310 nm, 1350 nm, or 1550 nm. In some embodiments, the invisible wavelength range is not more than 2000 nm. In some embodiments, the absorption layer 110 receives an optical signal and converts the optical signal into electrical signals. In some embodiments, the absorption layer 110 includes polycrystalline material. In some embodiments, the absorption layer 110 includes GeSi, Si or Ge. In some embodiments, the absorption layer 110 includes amorphous GeSi. In some embodiments, the absorption layer 110 is composed of GeSi, Si or Ge. In some embodiments, the absorption layer 110 is a germanium region. In some embodiments, the absorption layer 110 including intrinsic germanium is of p-type due to material defects formed during formation of the absorption layer 110, wherein the defect density is from $1\times10^{14}$ cm$^{-3}$ to $1\times10^{16}$ cm$^{-3}$.

Referring to FIG. 1A, in some embodiments, the absorption layer 110 has a thickness depending on the wavelength of photons to be detected and the material of the absorption layer 110. In some embodiments, when the absorption layer 110 includes germanium and is designed to absorb photons having a wavelength not less than 800 nm, the absorption layer 110 has a thickness not less than 0.1 um. In some embodiments, the absorption layer 110 includes germanium and is designed to absorb photons having a wavelength between 800 nm and 2000 nm, the absorption layer 110 10 has a thickness between 0.1 um and 2.5 um. In some embodiments, the absorption layer 110 has a thickness between 1 um and 2.5 um for higher quantum efficiency. In some embodiments, the absorption layer 110 may be grown using a blanket epitaxy, a selective epitaxy, or other applicable techniques.

Referring to FIG. 1A, in some embodiments, the first doped region 130 includes a first dopant having a first peak doping concentration. In some embodiments, the second doped region 140 includes a second dopant having a second peak doping concentration. The first peak doping concentration of the first dopant of the first doped region 130 is designed to depend on the material of the first contact layer 160 and the material of the absorption layer 110, for example, between $1\times10^{19}$ cm$^{-3}$ to $5\times10^{21}$ cm$^{-3}$. The peak doping concentration of the second dopant of the second doped region 140 is designed to depend on the material of the second contact layer 170 and the material of the absorption layer 110, for example, between $1\times10^{19}$ cm$^{-3}$ to $5\times10^{21}$ cm$^{-3}$.

Referring to FIG. 1A, in some embodiments, the counter-doped region 150 includes a third dopant having a third peak doping concentration. The third peak doping concentration is not less than $1\times10^{16}$ cm$^{-3}$. In some embodiment, the third peak doping concentration is lower than the first peak doping concentration. In some embodiments, the third peak doping concentration is between $5\times10^{18}$ cm$^{-3}$ and $5\times10^{20}$ cm$^{-3}$. In some embodiments, if the photo-detecting device is configured to process the collected electrons for further application, the first dopant includes an n-type dopant. The second dopant includes a p-type dopant. The third dopant includes a p-type dopant. The p-type dopant includes a group-III element. In some embodiments, p-type dopant is boron. In some embodiments, n-type dopant includes a group-V element. In some embodiments, n-type dopant is phosphorous.

Referring to FIG. 1A, in some embodiments, the first doped region 130 may include the first dopant and the third dopant. In some embodiments, the third dopant may diffuse into the first doped region 130 from the counter-doped region 150. In some embodiments, the third dopant may be implanted into a part of the first doped region 130 during the step of implanting the third dopant to form counter-doped region 150. In some embodiments, the first peak doping concentration of the first dopant is higher, for example, 10 times higher than the doping concentration of the third dopant in the first doped region 130. In some embodiments, the part of the first doped region 130 near the counter-doped region 150 includes boron and phosphorous, wherein the peak doping concentration of phosphorous is about $5\times10^{20}$ cm$^{-3}$, and the peak doping concentration of boron in the first doped region 130 is about $5\times10^{18}$ cm$^{-3}$.

Referring to FIG. 1A, in some embodiments, the substrate 120 includes any suitable material that the absorption layer 110 can be fabricated on. In some embodiments, the material of the substrate 120 is different from the material of the absorption layer 110. In some embodiments, the substrate 120 includes silicon. In some embodiments, the substrate 120 is composed of a single material. In some embodiments, the substrate 120 is composed of silicon. In some embodiments, the substrate 120 includes multiple materials, for example, the substrate 120 includes an insulating material and a semiconductor material. In some embodiment, the substrate 120 includes $SiO_2$.

Referring to FIG. 1A, in some embodiments, the substrate 120 includes a first surface 121 and a second surface 122 opposite to the first surface 121. In some embodiments, the absorption layer 110 is on the first surface 121 of the substrate 120.

Compared to a photo-detecting device devoid of a counter-doped region 150 surrounding the first doped region 130, the photo-detecting device including a counter-doped region 150 surrounding the first doped region 130 has a thinner depletion region not touching the bottom surface 112 of the absorption layer 110, and thus the photo-detecting device is with lower dark current.

Figure 1B:
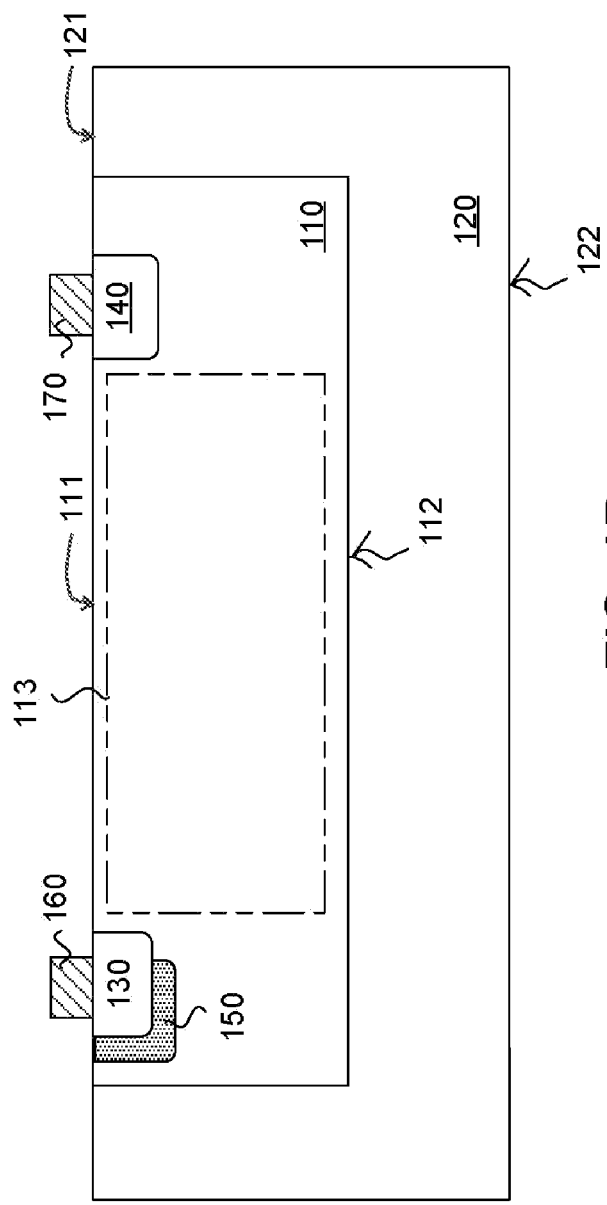
FIG. 1B illustrates a cross-sectional view of a semiconductor device, according to some embodiments.

FIG. 1B illustrates a cross-sectional view of a semiconductor device, according to some embodiments. The semiconductor device in FIG. 1B is similar to the semiconductor device in FIG. 1A, the difference is described below. The absorption layer 110 is fully embedded in the substrate 120. In some embodiments, the top surface 111 of the absorption layer 110 is substantially flush with the first surface 121 of the substrate 120. In some embodiments, the absorption layer 110 is partially embedded in the substrate 120. In some embodiments, the first surface 121 of the substrate 120 is between the top surface 111 of the absorption layer 110 and the second surface 122 of the substrate 120.

Figure 2:
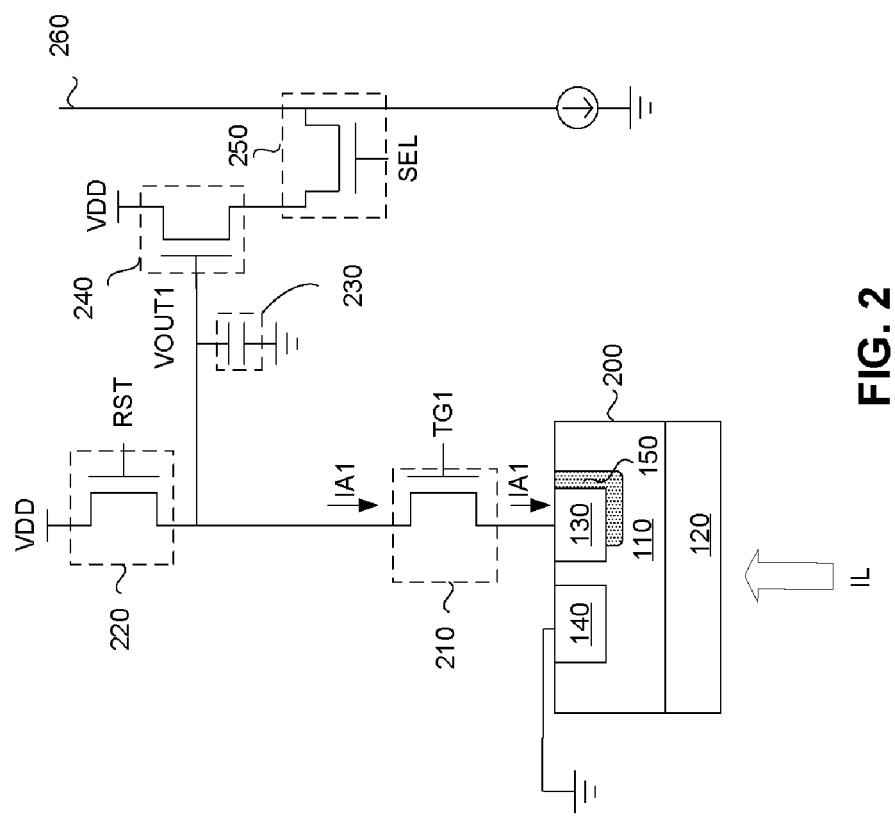
FIG. 2 show a schematic diagram of a photo-detecting system.

FIG. 2 show a schematic diagram of a photo-detecting system. The photo-detecting system may be an CMOS image sensor. The photo-detecting system includes a photo-detecting device 200, a transfer transistor 210, a reset transistor 220, a capacitor 230, a source-follower transistor 240, a row selection transistor 250 and a column bus 260. The transfer transistor 210 transfers carriers from the photo-detecting device 200 to the capacitor 230. In other words, the transfer transistor 210 is configured to output a photo-current IA1 according to a switch signal TG1. When the switch signal TG1 turns on the transfer transistor 210, the photo-current IA1 will be generated. The photo-detecting device 200 can be any embodiments described in FIG. 1A and FIG. 1B. The photo-detecting system including the photo-detecting device 200 is with lower dark current and higher signal-to-noise ratio. The row selection transistor 250 is controlled by a select control signal SEL.

At the beginning, the reset signal RST resets the output voltage VOUT1 to a voltage VDD. When the switch signal TG1 turns on the transfer transistor 210, the photo-current IA1 is generated, the output voltage VOUT1 on the capacitor 230 will drop until the switch signal TG1 turns off the transfer transistor 210. After the switch signal TG1 turns off the transfer transistor 210, the output voltage VOUT1 will be maintained at a constant value corresponding the image intensity.

In some embodiments, the photo-detecting system is operated at a frame rate not more than 1000 frames per second (fps).

Figure 3A:
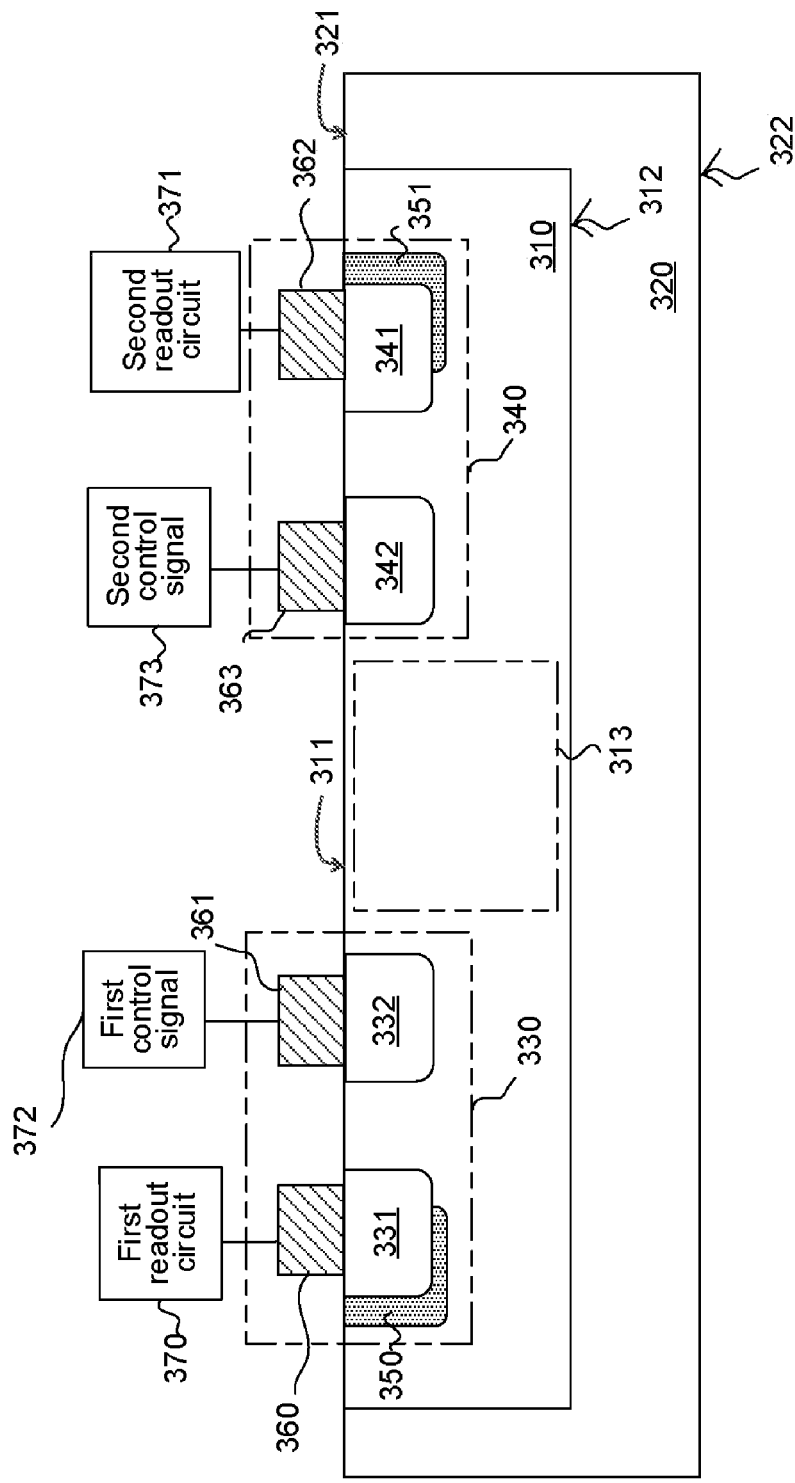
FIG. 3A illustrates a cross-sectional view of a semiconductor device, according to some embodiments.

FIG. 3A illustrates a cross-sectional view of a semiconductor device, according to some embodiments. In some embodiments, the semiconductor device is a photo-detecting device. The photo-detecting device is capable of converting an optical signal to an electrical signal. The photo-detecting device can be used in time-of-flight (TOF) applications, in which depth information of a three-dimensional object may be determined by using a phase difference between a transmitted light pulse and a detected light pulse. The photo-detecting device includes an absorption layer 310 and a substrate 320 supporting the absorption layer 310. The photo-detecting device further includes a first switch 330 and a second switch 340 physically separated from the first switch 330. The first switch 330 and the second switch 340 are in the absorption layer 310. In some embodiments, the first switch 330 includes a first doped region 331 and a third doped region 332. The second switch 340 includes a second doped region 341 and a fourth doped region 342. The photo-detecting device further includes a first counter-doped region 350 and a second counter-doped region 351. The first counter-doped region 350 is adjacent to the first doped region 331. The second counter-doped region 351 is adjacent to the second doped region 341. In some embodiments, the photo-detecting device further includes a first readout circuit 370, a second readout circuit 371, a first control signal 372 and a second control signal 373. The first readout circuit 370 is electrically connected to the first doped region 331. The second readout circuit 371 is electrically to the second doped region 341. The first control signal 372 is electrically coupled to the third doped region 332. The second control signal 373 is electrically coupled to the fourth doped region 342.

Referring to FIG. 3A, the absorption layer 310 is similar to the absorption layer 110 as described in FIG. 1A. For example, the absorption layer 310 includes a top surface 311 and a bottom surface 312 opposite to the top surface 311. The absorption layer 310 includes a detection region 313 defined by, alight shield or an optical element as described in FIG. 1A. In some embodiments, the detection region 313 is between the first doped region 331 and the second doped region 341. In some embodiments, the detection region 313 is between the third doped region 332 and the fourth doped region 342. In some embodiments, a width of the detection region 313 is greater than a distance between the third contact layer 361 and the fourth contact layer 363. The substrate 320 is similar to the substrate 120 as described in FIG. 1A. For example, the substrate 320 includes a first surface 321 and a second surface 322 opposite to the first surface 321. For another example, the material of the substrate 320 is different form the material of the absorption layer 310, such as the substrate 320 includes Si, and the absorption layer 310 includes germanium. In some embodiments, light absorbed by the absorption layer 310 is reflected from a three-dimensional object.

Referring to FIG. 3A, the substrate 320 includes a first surface 321 and a second surface 322 opposite to the first surface 321. In some embodiments, the absorption layer 310 is fully embedded in the substrate 320. In some embodiments, the top surface 311 of the absorption layer 310 is substantially flush with the first surface 321 of the substrate 320. In some embodiments, the absorption layer 310 is partially embedded in the substrate 320. In some embodiments, the first surface 321 of the substrate 320 is between the top surface 311 of the absorption layer 310 and the second surface 322 of the substrate 320. In some embodiments, the absorption layer 310 is entirely on the first surface 321 of the substrate 320, as described in FIG. 1A.

Referring to FIG. 3A, in some embodiments, the photo-detecting device further includes a first contact layer 360, a second contact layer 362, a third contact layer 361 and a fourth contact layer 363. The first contact layer 360 connects the first doped region 331 to the first readout circuit 370. The second contact layer 362 connects the second doped region 341 to the second readout circuit 371. The third contact layer 361 connects the third doped region 332 to the first control signal 372. The fourth contact layer 363 connects the fourth doped region 342 to the second control signal 373. In some embodiments, the first contact layer 360, the second contact layer 362, the third contact layer 361 and the fourth contact layer 363 include metals or alloys. For example, the first contact layer 360, the second contact layer 362, the third contact layer 361 and the fourth contact layer 363 include Al, Cu, W, Ti, Ta—TaN—Cu stack, Ti—TiN—W stack. In some embodiments, the first contact layer 360, the second contact layer 362, the third contact layer 361 and the fourth contact layer 363 include metal silicide or metal germanide. Metal Silicide includes, but is not limited to nick silicide. In some embodiments, the detection region 313 is between the third contact layer 361 and the fourth contact layer 363.

In some embodiments, the photo-detecting device further includes an interface layer (not shown) covering the top surface 311 of the absorption layer 310 and covers a portion of the first surface 321 of the substrate 320. In some embodiments, the interface layer further covers a sidewall of the absorption layer 310 exposed from the substrate 320. The interface layer may include amorphous silicon, poly-silicon, aluminum oxide (e.g., $Al_xO_y$), silicon oxide (e.g., $Si_xO_y$), Ge oxide (e.g., $Ge_xO_y$), germanium-silicon (e.g., GeSi), silicon nitride family (e.g., $Si_xN_y$), high-k materials (e.g. $HfO_x$, $ZnO_x$, $LaO_x$, $LaSiO_x$), and any combination thereof. The presence of the interface layer may have various effects. For example, the interface layer may act as a surface passivation layer to the absorption layer 310, which may reduce dark current or leakage current generated by defects occurred at the exposed surface of the absorption layer 310. In some embodiments, the first doped region 331, the second doped region 341, the third doped region 332 and the fourth doped region 342 may be extended into the interface layer.

Referring to FIG. 3A, in some embodiments, the first doped region 331 is of a first conductivity type. The second doped region 341 is of a second conductivity type the same as the first conductivity type. In some embodiments, the first doped region 331 includes a first dopant having a first peak doping concentration. In some embodiments, the second doped region 341 includes a second dopant having a second peak doping concentration. In some embodiments, the first peak doping concentration is to allow an Ohmic contact formed between the first doped region 331 and the first contact layer 360. The first peak doping concentration of the first dopant of the first doped region 331 is designed to depend on the material of the first contact layer 360 and the material of the absorption layer 310, for example, between $1\times10^{19}$ $cm^{-3}$ to $5\times10^{21}$ $cm^{-3}$. In some embodiments, the second peak doping concentration is to allow an Ohmic contact formed between the second doped region 341 and the second contact layer 362. The second peak doping concentration of the second dopant of the second doped region 341 is designed to depends on the material of the second contact layer 362 and the material of the absorption layer 310, for example, between $1\times10^{19}$ $cm^{-3}$ to $5\times10^{21}$ $cm^{-3}$. In some embodiments, the third doped region 332 is of a third conductivity type different from the first conductivity type. The fourth doped region 342 is of a fourth conductivity type the same as the third conductivity type. In some embodiments, the third doped region 332 includes a third dopant having a third peak doping concentration. In some embodiments, the fourth doped region 342 includes a fourth dopant having a fourth peak doping concentration. In some embodiments, the third peak doping concentration is to allow an Ohmic contact formed between the third doped region 332 and the third contact layer 361. The third peak doping concentration of the third dopant of the third doped region 332 is designed to depends on the material of the third contact layer 361 and the material of the absorption layer 310, for example, between $1\times10^{19}$ cm$^{-3}$ to $5\times10^{21}$ cm$^{-3}$. In some embodiments, the third peak doping concentration is not sufficient to allow an Ohmic contact formed between the third doped region 332 and the third contact layer 361, such as below approximately $1\times10^{15}$ cm$^{-3}$, and thus the third doped region 332 forms a Schottky junction to the third contact layer 361. In some embodiments, the fourth peak doping concentration is to allow an Ohmic contact formed between the fourth doped region 342 and the fourth contact layer 363. The fourth peak doping concentration of the fourth dopant of the fourth doped region 342 is designed to depend on the material of the fourth contact layer 363 and the material of the absorption layer 310, for example, between $1\times10^{19}$ cm$^{-3}$ to $5\times10^{21}$ cm$^{-3}$. In some embodiments, the fourth peak doping concentration is not sufficient to allow an Ohmic contact formed between the fourth doped region 342 and the fourth contact layer 363, such as below approximately $1\times10^{15}$ cm$^{-3}$, and thus the fourth doped region 342 forms a Schottky junction to the fourth contact layer 363. In some embodiments, the first doped region 331 and the second doped region 341 are carrier collection regions to collect the same type of photo-carriers. The third doped region 332 and the fourth doped region 342 are carrier modulation regions for attracting the same type photo-carriers by controlling the first control signal 372 and the second control signal 373.

Referring to FIG. 3A, in some embodiments, the first counter-doped region 350 surrounds a portion of the first doped region 331 father from the second doped region 341, and the other portion of the first doped region 331 is not surrounded by the first counter-doped region 350. In some embodiments, the first counter-doped region 350 entirely surrounds the first doped region 331. In some embodiments, the second counter-doped region 351 surrounds a portion of the second doped region 341 father from the first doped region 331, and the other portion of the second doped region 341 is not surrounded by the second counter-doped region 351. The first counter-doped region 350 and the second counter-doped region 351 serve as dark-current reduction regions made for reducing the dark current of the photo-detecting device. In some embodiments, the first doped region 331, the third doped region 332, the second doped region 341, and the fourth doped region 342 are between the first counter-doped region 350 and the second counter-doped region 351 from a cross-sectional view of the photo-detecting device. In some embodiments, the second counter-doped region 351 entirely surrounds the second doped region 341. In some embodiments, the first counter-doped region 350 is of a conductivity type different from the first conductivity type of the first doped region 331. In some embodiments, the first counter-doped region 350 includes a fifth dopant having a fifth peak doping concentration. The fifth peak doping concentration is not less than $1\times10^{16}$ cm$^{-3}$. In some embodiment, the fifth peak doping concentration is lower than the first peak doping concentration of the first doped region 331. In some embodiments, the fifth peak doping concentration is between $5\times10^{18}$ cm$^{-3}$ and $5\times10^{20}$ cm$^{-3}$. In some embodiments, the second counter-doped region 351 includes a sixth dopant having a sixth peak doping concentration. The sixth peak doping concentration is not less than $1\times10^{16}$ cm$^{-3}$. In some embodiment, the sixth peak doping concentration is lower than the second peak doping concentration of the second doped region 341. In some embodiments, the sixth peak doping concentration is between $5\times10^{18}$ cm$^{-3}$ and $5\times10^{20}$ cm$^{-3}$. In some embodiments, if the photo-detecting device is configured to collect electrons, the first dopant includes an n-type dopant. The third dopant includes a p-type dopant. The second dopant includes an n-type dopant. The fourth dopant includes a p-type dopant. The fourth dopant includes a p-type dopant. The fifth dopant includes a p-type dopant. The sixth dopant includes a p-type dopant. In some embodiments, the first dopant and the second dopant are the same. In some embodiments, the third dopant, the fourth dopant, the fifth dopant and the sixth dopant are the same. In some embodiments, the p-type dopant includes a group-III element. In some embodiments, p-type dopant is boron. In some embodiments, n-type dopant includes a group-V element. In some embodiments, n-type dopant is phosphorous.

In some embodiments, the first doped region 331 may include the first dopant and the fifth dopant. In some embodiments, the fifth dopant may diffuse into the first doped region 331 from the first counter-doped region 350. In some embodiments, the fifth dopant may be implanted into a part of the first doped region 331 during the step of implanting the fifth dopant to form the first counter-doped region 350. In some embodiments, the first peak doping concentration of the first dopant is higher, for example, 10 times higher than the peak doping concentration of the fifth dopant in the first doped region 331. In some embodiments, the part of the first doped region 331 near the first counter-doped region 350 includes boron and phosphorous, wherein the peak doping concentration of phosphorous is about $5\times10^{20}$ cm$^{-3}$, and the peak doping concentration of boron in the first doped region 331 is about $5\times10^{18}$ cm$^{-3}$. In some embodiments, the second doped region 341 may include the second dopant and the sixth dopant. In some embodiments, the sixth dopant may diffuse into the second doped region 341 from the second counter-doped region 351. In some embodiments, the sixth dopant may be implanted into a part of the second doped region 341 during the step of implanting the sixth dopant to form the second counter-doped region 351. In some embodiments, the second peak doping concentration of the second dopant is higher, for example, 10 times higher than the doping concentration of the sixth dopant in the second doped region 341. In some embodiments, the part of the second doped region 341 near the second counter-doped region 351 includes boron and phosphorous, wherein the peak doping concentration of phosphorous is about $5\times10^{20}$ cm$^{-3}$, and the peak doping concentration of boron in the second doped region 341 is about $5\times10^{18}$ cm$^{-3}$.

Referring to FIG. 3A, the first control signal 372 and the second control signal 373 are used to control the collection of electrons generated by the absorbed photons in the absorption layer 310. For example, if the photo-detecting device is configured to collect electrons, the first doped region 331 is of n-type, the third doped region 332 is of p-type, the second doped region 341 is of n-type, the fourth doped region 342 is of p-type, the first counter-doped region 350 is of p-type and the second counter-doped region 351 is of p-type. When voltages are applied, if the first control signal 372 is biased different from the second control signal 373, an electric field is created between the third doped region 332 and the fourth doped region 342, and electrons of the photo-carriers drift towards one of the third doped region 332 or the fourth doped region 342 depending on the direction of the electric field. In some embodiment, the first control signal 372 may be fixed at a voltage value V, and the second control signal 373 may alternate between voltage values V±ΔV. The direction of the bias value determines the moving direction of the electrons. Accordingly, when the first switch 330 is switched on and the second switch 340 is switched off, the electrons drift towards the third doped region 332 and are blocked from the fourth doped region 342. In some embodiments, the first control signal 372 is a fixed at a voltage value V (e.g., 0.5 v) and the second control signal 373 is a varying voltage signal (e.g., sinusoid signal, clock signal or pulse signal operated at 0V or 1V). In some embodiments, the first control signal 372 and the second control signal 373 may be voltages that are differential to each other. For example, When the first switch 330 is switched on and the second switch 340 is switched off, the electrons drift towards the third doped region 332 since an electric field is created between the third doped region 332 and the fourth doped region 342, and the electric field between the third doped region 332 and the first doped region 331 further guides the electrons to the first doped region 331. The first readout circuit 370 may then be enabled to process the electrons collected by the first doped region 331. On the other hand, when the second switch 340 is switched on and the first switch 330 is switched off, the electrons drift towards fourth doped region 342 since an electric field is created between the third doped region 332 and the fourth doped region 342, and the electric field between the fourth doped region 342 and the second doped region 341 further guides the electrons to the second doped region 341. The second readout circuit 371 may then be enabled to process the electrons collected by the second doped region 341. In the present disclosure, in a same photo-detecting device, the type of the carriers collected by the first doped region 331 and the type of the carriers collected by the third doped region 332 are the same. The two switches of the photo-detecting device may collect the photo-carriers at different optical phases for a time-of-flight system.

In some embodiments, the substrate 320 may be coupled to an external control signal (not shown). For example, the substrate 320 may be coupled to an electrical ground, or a preset voltage less than the voltages at the first doped region 331 and the second doped region 341, if the photo-detecting device is configured to collect electrons. In some embodiments, the substrate 320 may be floated and not coupled to any external control signal.

Referring to FIG. 3A, the first readout circuit 370 is configured to output a first readout voltage. The second readout circuit 371 is configured to output a second readout voltage. In some embodiments, the first readout circuit 370 and the second readout circuit 371 each includes three transistors consisting of a reset gate (not shown), a source-follower (not shown), and a selection gate (not shown). In some embodiments, each of the first readout circuit 370 and the second readout circuit 371 includes four or more transistors (not shown), or any suitable electronic components (not shown) for processing carriers.

In some embodiments, the first readout circuit 370 includes a first capacitor (not shown). The first capacitor is configured to store the photo-carriers collected by the first doped region 331. In some embodiments, the first capacitor is electrically coupled to the reset gate of the first readout circuit 370. In some embodiments, the first capacitor is between the source-follower of the first readout circuit 370 and the reset gate of the first readout circuit 370. In some embodiments, the second readout circuit 371 includes a second capacitor (not shown). In some embodiments, the second capacitor is configured to store the photo-carriers collected by the second doped region 341. In some embodiments, the second capacitor is electrically coupled to the reset gate of the second readout circuit 371. In some embodiments, the second capacitor is between the source-follower of the second readout circuit 371 and the reset gate of the second readout circuit 371. Examples of the first capacitor and the second capacitor include, but is not limited to, floating-diffusion capacitors, metal-oxide-metal (MOM) capacitors, metal-insulator-metal (MIM) capacitors, and metal-oxide-semiconductor (MOS) capacitors.

In some embodiments, when the first doped region 331 and the second doped region 341 are configured to collect electrons, during the operation of the photo-detecting device, the first capacitor of the first readout circuit 370 and the second capacitor of the second readout circuit 371 are charged to a preset voltage via the reset gate of the first readout circuit 370 and the reset gate of the second readout circuit 371 respectively. Once the charging of the first capacitor and the second capacitor are completed, the first capacitor starts to store the portion of the photo-carriers collected from the first doped region 331 and the second capacitor starts to store the portion of the photo-carriers collected from the second doped region 341.

In some embodiments, the photo-detecting device includes a light shield similar to the light shield described in FIG. 1A.

Compared to a photo-detecting device devoid of a first counter-doped region 350 surrounding the first doped region 331 and a second counter-doped region 351 surrounding the second doped region 341, the photo-detecting device including the first counter-doped region 350 surrounding the first doped region 331 and including the second counter-doped region 351 surrounding the second doped region 341 has a thinner depletion region around the first doped region 331 and a thinner depletion region around the second doped region 341, and the two depletion regions do not touch the bottom surface 312 of the absorption layer 310. Accordingly, the photo-detecting device is with lower dark current. Besides, with the first switch 330 and the second switch 340 integrated with a single absorption layer 310, the photo-detecting device is with both improved demodulation contrast and lower dark current.

Figure 3B:
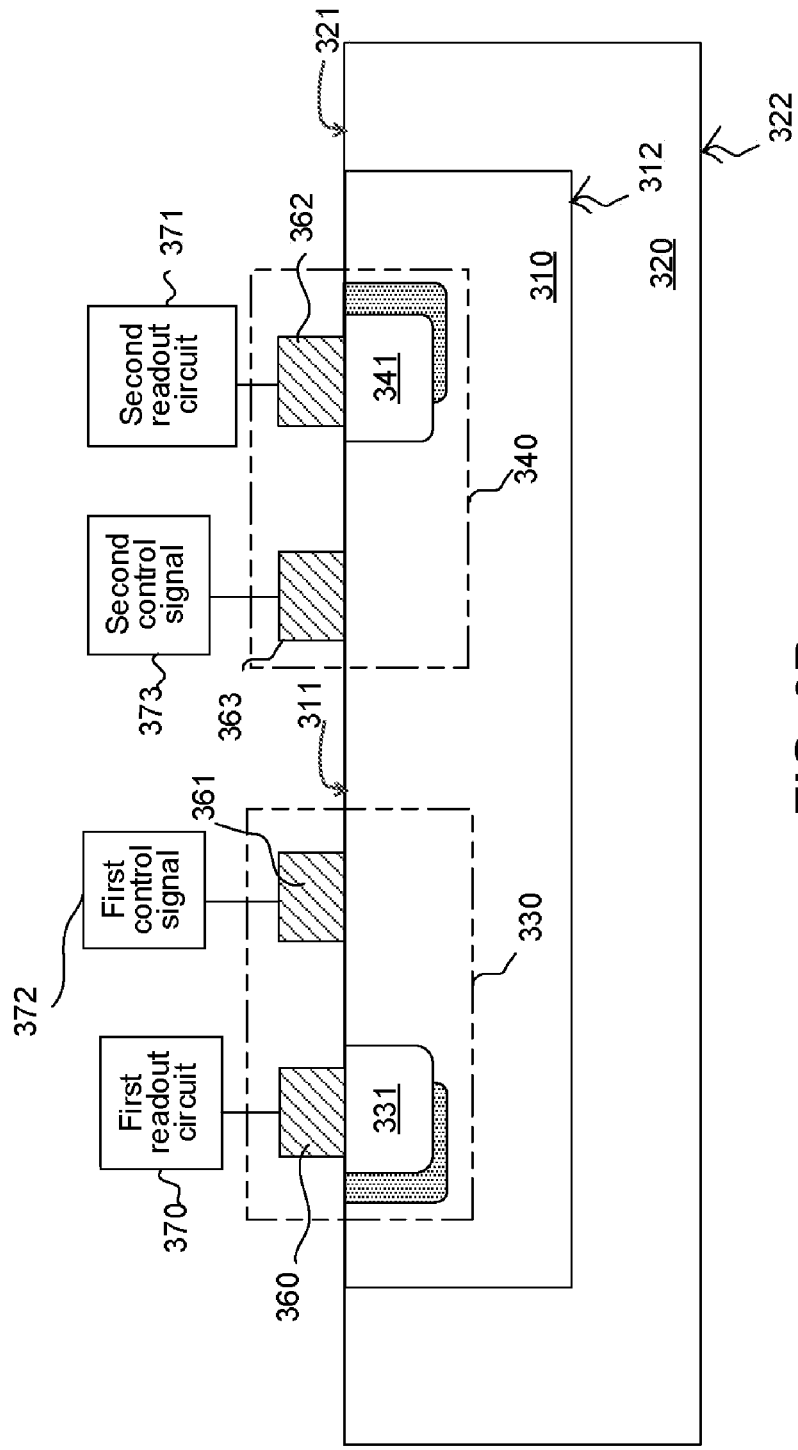
FIG. 3B illustrates a cross-sectional view of a semiconductor device, according to some embodiments.

FIG. 3B illustrates a cross-sectional view of a semiconductor device, according to some embodiments. The semiconductor device in FIG. 3B is similar to the semiconductor device in FIG. 3A, the difference is described below. In some embodiments, the photo-detecting device is devoid of the third doped region 332 and the fourth doped region 342. The third contact layer 361 forms a Schottky junction to the absorption layer 310 or the interface layer. The fourth contact layer 363 forms a Schottky junction to the absorption layer 310 or the interface layer.

Figure 4:
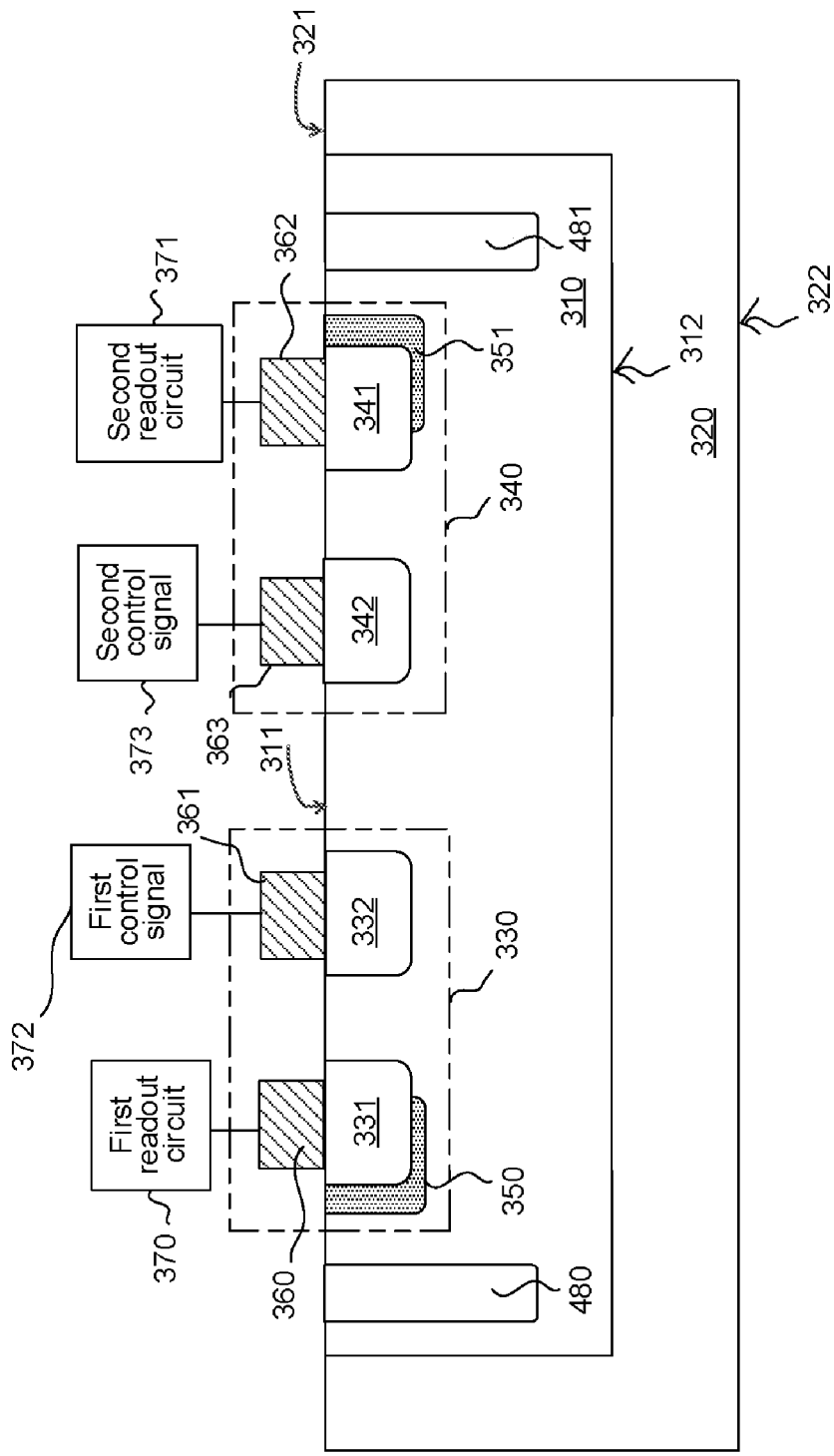
FIG. 4 illustrates a cross-sectional view of a semiconductor device, according to some embodiments.

FIG. 4 illustrates a cross-sectional view of a semiconductor device, according to some embodiments. The semiconductor device in FIG. 4 is similar to the semiconductor device in FIG. 3A, the difference is described below. In some embodiments, the photo-detecting device further includes a fifth doped region 480 and a sixth doped region 481 in the absorption layer 310. The first doped region 331, the third doped region 332, the second doped region 341, the fourth doped region 342, the first counter-doped region 350, and the second counter-doped region 351 are between the fifth doped region 480 and the sixth doped region 481 from a cross-sectional view of the photo-detecting device. In some embodiments, a distance between the fifth doped region 480 and the first counter-doped region 350 is less than a distance between the fifth doped region 480 and the first doped region 331 from a cross-sectional view of the photo-detecting device. In some embodiments, a distance between the sixth doped region 481 and the second counter-doped region 351 is less than a distance between the sixth doped region 481 and the second doped region 341 from a cross-sectional view of the photo-detecting device. The fifth doped region 480 and the sixth doped region 481 are beneath the top surface 311 of the absorption layer 310. In some embodiments, the fifth doped region 480 is physically separated from the first counter-doped region 350. The sixth doped region 481 is physically separated from the second counter-doped region 351. In some embodiments, the fifth doped region 480 touches the first counter-doped region 350. The sixth doped region 481 touches the second counter-doped region 351. In some embodiments, the fifth doped region 480 is of a fifth conductivity type the same as conductivity type of the first counter-doped region 350. The sixth doped region 481 is of a sixth conductivity type the same as conductivity type of the second counter-doped region 351. In some embodiments, the fifth doped region 480 includes a dopant having a peak doping concentration higher than the fifth peak doping concentration of the first counter-doped region 350. In some embodiments, the peak doping concentration of the fifth doped region 480 is not higher than the first peak doping concentration of the first doped region 331. In some embodiments, the peak doping concentration of the fifth doped region 480 is between $5 \times 10^{18}$ cm$^{-3}$ and $5 \times 10^{20}$ cm$^{-3}$. In some embodiments, the sixth doped region 481 includes a dopant having a peak doping concentration higher than the sixth peak doping concentration of the second counter-doped region 351. In some embodiments, the peak doping concentration of the sixth doped region 481 is not higher than the second peak doping concentration of the second doped region 341. In some embodiments, the peak doping concentration of the sixth doped region 481 is between $5 \times 10^{18}$ cm$^{-3}$ and $5 \times 10^{20}$ cm$^{-3}$. In some embodiments, the fifth doped region 480 is of p-type and the sixth doped region 481 is of p-type if the photo-detecting device is configured to collect electrons at the first doped region 331 and the second doped region 341. In some embodiments, the fifth doped region 480 includes a depth deeper than a depth of the first doped region 331. In some embodiments, the sixth doped region 481 includes a depth deeper than a depth of the second doped region 341. The fifth doped region 480 and the sixth doped region 481 may regarded as blocking regions for blocking those photo-carriers not collected by the first doped region 331 and the second doped region 341 from reaching the interface between the absorption layer 310 and the substrate 320, where material defects may be present. The material defects may capture the photo-carriers and release the carriers after some period of time, which may be collected by the first doped region 331 and the second doped region 341. Such capture and release of the carriers by the material defects at the interface and subsequent collection by the first doped region 331 and the second doped region 341 may reduce the bandwidth of the photo-detecting device due to the time delay caused by the capturing and releasing of the carriers. Accordingly, by forming the fifth doped region 480 and the sixth doped region 481, bandwidth-reduction of the photo-detecting device may be mitigated. Furthermore, by the combination of the fifth doped region 480, the sixth doped region 481, the first counter-doped region 350, and the second counter-doped region 351, the dark current of the photo-detecting device can be further reduced. In some embodiments, the fifth doped region 480 and the sixth doped region 481 can be a part of a continuous region, for example, the continuous region can be, but is not limited to a ring, or a square annular from a top view of the semiconductor device. In some embodiments, the continuous region surrounds the first doped region 331, the second doped region 341, third doped region 332, the fourth doped region 342, first counter-doped region 350 and the second counter-doped region 351.

Figure 5B:
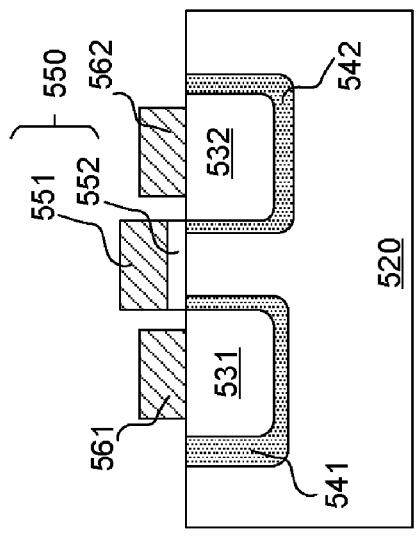
FIG. 5B illustrates a cross-sectional view of a semiconductor device, according to some embodiments.
Figure 5A:
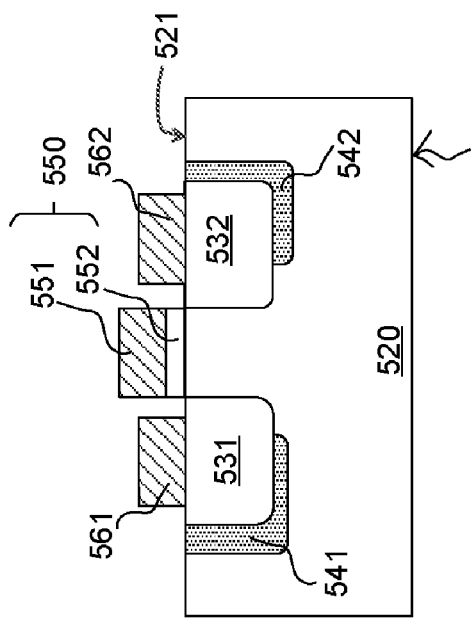
FIG. 5A illustrates a cross-sectional view of a semiconductor device, according to some embodiments.

FIG. 5A illustrates a cross-sectional view of a semiconductor device, according to some embodiments. In some embodiments, the semiconductor device is a transistor. The transistor includes a substrate 520, a first doped region 531, a second doped region 532, a first counter-doped region 541, a second counter-doped region 542 and a gate electrode 550. The substrate 520 includes semiconductor material, such as germanium or silicon. In some embodiments, the substrate 520 is composed of intrinsic germanium. The substrate 520 includes a first surface 521 and a second surface 522 opposite to the first surface 521. The first doped region 531 and the second doped region 532 are formed beneath the first surface 521 by any suitable method such as implanting suitable dopants in the substrate 520. The first surface 521 of the substrate 522 is between the gate electrode 550 and the second surface 522. The first doped region 531 is of a first conductivity type. The second doped region 532 is of a second conductivity type the same as the first conductivity type. The first doped region 531 is regarded as a source region of the transistor. The second doped region 532 is regarded as a drain region of the transistor. The first counter-doped region 541 surrounds a portion of the first doped region 531, and the other portion of the first doped region 531 is not surrounded by the first counter-doped region 541. The second counter-doped region 542 surrounds a portion of the second doped region 532, and the other portion of the second doped region 532 is not surrounded by the second counter-doped region 542. The first counter-doped region 541 is of a third conductivity type different from the first conductivity type. The second counter-doped region 542 is of a fourth conductivity type different from the second conductivity type. The first counter-doped region 541 and the second counter-doped region 542 are dark-current reduction regions made for reducing the dark current of the transistor.

Referring to FIG. 5A, the transistor further includes a first contact layer 561 and a second contact layer 562. The first contact layer 561 is electrically coupled to the first doped region 531. The second contact layer 562 is electrically coupled to the second doped region 532. The material of the first contact layer 561 and the second contact layer 562 are similar to the first contact layer 160 and the second contact layer 170 as described in FIG. 1A. The gate electrode 550 is between the first contact layer 561 and the second contact layer 562. The gate electrode 550 includes a gate contact layer 551 and an insulating layer 552. The gate contact layer 551 is on the substrate 520. The insulating layer 552 is between the gate contact layer 551 and the substrate 520. The insulating layer 552 prevents direct current conduction from the gate contact layer 551 to the substrate 520, but allows an electric field to be established within the substrate 520 in response to an application of a voltage to the gate contact layer 551. The established electric field attracts or repels carriers within the substrate 520. In some embodiments, the insulating layer 552 includes a high-k material including, but is not limited to, $Si_xN_y$, SiON, $SiO_x$, $GeO_x$, $Al_2O_3$, $TiO_2$, $Y_2O_3$, $HfO_2$ or $ZrO_2$. In some embodiment, the insulating layer 552 includes, but is not limited to $SiO_2$. The material of the gate contact layer 551 can be similar to the material o of the first contact layer 160 as described in FIG. 1A.

Referring to FIG. 5A, in some embodiments, the first doped region 531 includes a first dopant having a first peak doping concentration. In some embodiments, the second doped region 532 includes a second dopant having a second peak doping concentration. The first peak doping concentration of the first dopant of the first doped region 531 is designed to depend on the material of the first contact layer 561 and the material of the substrate 520, for example, between $1\times10^{19}$ $cm^{-3}$ to $5\times10^{21}$ $cm^{-3}$. The peak doping concentration of the second dopant of the second doped region 532 is designed to depend on the material of the second contact layer 562 and the material of the substrate 520, for example, between $1\times10^{19}$ $cm^{-3}$ to $5\times10^{21}$ $cm^{-3}$.

Referring to FIG. 5A, in some embodiments, the first counter-doped region 541 is of a conductivity type different from the first conductivity type of the first doped region 531. In some embodiments, the first counter-doped region 541 includes a third dopant having a third peak doping concentration. The third peak doping concentration is not less than $1\times10^{16}$ $cm^{-3}$. In some embodiment, the third peak doping concentration is lower than the first peak doping concentration of the first doped region 531. In some embodiments, the third peak doping concentration is between $5\times10^{18}$ $cm^{-3}$ and $5\times10^{20}$ $cm^{-3}$. In some embodiments, the second counter-doped region 542 includes a fourth dopant having a fourth peak doping concentration. The fourth peak doping concentration is not less than $1\times10^{16}$ $cm^{-3}$. In some embodiment, the fourth peak doping concentration is lower than the second peak doping concentration of the second doped region 532. In some embodiments, the fourth peak doping concentration is between $5\times10^{18}$ $cm^{-3}$ and $5\times10^{20}$ $cm^{-3}$. In some embodiments, the transistor is an nMOSFET. In some embodiments, the substrate 520 is composed of intrinsic germanium, the first doped region 531 is of n-type, the second doped region 532 is of n-type, the first counter-doped region 541 is of p-type, and the second counter-doped region 542 is of p-type. In some embodiments, the first dopant includes an n-type dopant. The second dopant includes a n-type dopant. The third dopant includes an p-type dopant. The fourth dopant includes a p-type dopant. In some embodiments, the first dopant and the second dopant are the same. In some embodiments, the third dopant and the fourth dopant are the same. In some embodiments, the p-type dopant includes a group-III element. In some embodiments, p-type dopant is boron. In some embodiments, n-type dopant includes a group-V element. In some embodiments, n-type dopant is phosphorous.

Compared to a transistor devoid of a first counter-doped region 541 surrounding the first doped region 531 and a second counter-doped region 542 surrounding the second doped region 532, the transistor including the first counter-doped region 541 and the second counter-doped region 542 is with lower dark current. Accordingly, the transistor is with lower off-state current, and thus is with a higher on/off ratio and lower power consumption.

In some embodiments, the gate electrode 550 is devoid of the insulating layer 552 between the gate contact layer 551 and the substrate 520, and a Schottky contact is formed between the gate contact layer 551 the substrate 520. The transistor is referred as an MESFET. Again, by forming the first counter-doped region 541 and the second counter-doped region 542, the transistor is with lower dark current.

FIG. 5B illustrates a cross-sectional view of a semiconductor device, according to some embodiments. The semiconductor device in FIG. 5B is similar to the semiconductor device in FIG. 3A, the difference is described below. The first counter-doped region 541 entirely surrounds the first doped region 531. The second counter-doped region 542 entirely surrounds the second doped region 532 and is physically separated from the first counter-doped region 541. The width of the second counter-doped region 542, the width of the first counter-doped region 541, the third peak doping concentration of the first counter-doped region 541, the fourth peak doping concentration of the second counter-doped region 542 and a distance between the first counter-doped region 541 and the second counter-doped region 542 can be adjusted such that the n-channel can be formed and carriers can flow between the first doped region 531 and the second doped region 532 during the operation of the transistor.

Figure 6:
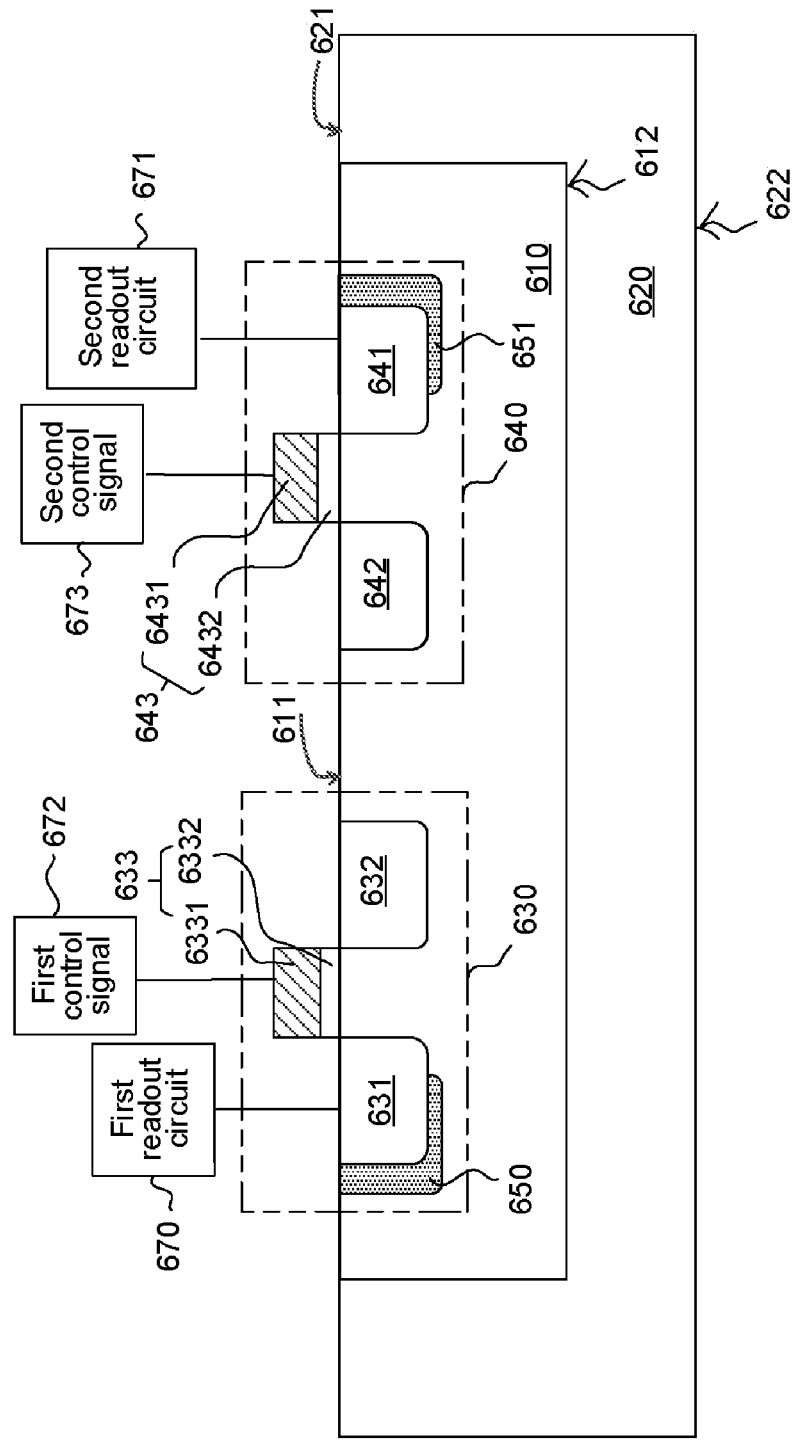
FIG. 6 illustrates a cross-sectional view of a semiconductor device, according to some embodiments.

FIG. 6 illustrates a cross-sectional view of a semiconductor device, according to some embodiments. In some embodiments, the semiconductor device is a photo-detecting device. The photo-detecting device is capable of converting an optical signal to an electrical signal. The photo-detecting device includes an absorption layer 610 and a substrate 620 supporting the absorption layer 610. In some embodiments, the substrate 620 is similar to the substrate 120 described in FIG. 1A. For example, the substrate 620 includes a first surface 621 and a second surface 622 opposite to the first surface 621. In some embodiments, the absorption layer 610 is similar to the absorption layer 110 described in FIG. 1A. For example, the absorption layer 610 includes a top surface 611 and a bottom surface 612 opposite to the top surface 611. For another example, the material of the substrate 620 is different form the material of the absorption layer 610, such as the substrate 620 includes Si, and the absorption layer 610 includes germanium. In some embodiments, light absorbed by the absorption layer 610 is reflected from a three-dimensional object.

Referring to FIG. 6, the photo-detecting device further includes a first switch 630 and a second switch 640 both electrically coupled to the absorption layer 610. The first switch 630 and the second switch 640 are configured to guide the photo-carriers generated by the absorption layer 610 to two different directions during the operation of the photo-detecting device. The second switch 640 is physically separated from the first switch 630. In some embodiment, the first switch 630 includes a first gate electrode 633, and the second switch 640 includes a second gate electrode 643. In some embodiment, the first gate electrode 633 and the second gate electrode 643 are both over the top surface 611 of the absorption layer 610. In some embodiments, the first gate electrode 633 includes a first contact layer 6331 over the top surface 611 of the absorption layer 610. In some embodiments, the second gate electrode 643 includes a second contact layer 6431 over the top surface 611 of the absorption layer 610. In some embodiments, a Schottky contact is formed between the first contact layer 6331 and the absorption layer 610. In some embodiments, a Schottky contact is formed between the second contact layer 6431 and the absorption layer 610. In some embodiments, the first gate electrode 633 includes a first insulating layer 6332 between the absorption layer 610 and the first contact layer 6331. In some embodiments, the second gate electrode 643 includes a second insulating layer 6432 between the second contact layer 6431 and the absorption layer 610. In some embodiments, the material of the first contact layer 6331 and the material of the second contact layer 6431 are similar to the material of the first contact layer 160 and the material of the second contact layer 170 as described in FIG. 1A. The first insulating layer 6332 and the second insulating layer 6432 prevent direct current conduction from the first contact layer 6331 to the absorption layer 610 and from the second contact layer 6431 to the absorption layer 610 respectively, but allows an electric field to be established within the absorption layer 610 in response to an application of a voltage to the first contact layer 6331 and the second contact layer 6431 respectively. The established electric field attracts or repels charge carriers within the absorption layer 610. In some embodiment, the material of the first insulating layer 6332 and the material of the second insulating layer 6432 are similar to the material of the insulating layer 552 as described in FIG. 5A.

Referring to FIG. 6, in some embodiments, the first switch 630 further includes a first doped region 631 and a third doped region 632 physically separated from the first doped region 631. The first gate electrode 633 is between the first doped region 631 and the third doped region 632. The second switch 640 further includes a second doped region 641 and a fourth doped region 642 physically separated from the second doped region 641. The first doped region 631, the third doped region 632, the second doped region 641 and the fourth doped region 642 are formed in the absorption layer 610 and beneath the top surface 611 of the absorption layer 610. The second gate electrode 643 is between the second doped region 641 and the fourth doped region 642. In some embodiments, photo-detecting device further includes a first counter-doped region 650 adjacent to the first doped region 631. In some embodiments, photo-detecting device further includes a second counter-doped region 651 adjacent to the second doped region 641. The first counter-doped region 650 and the second counter-doped region 651 are both formed in the absorption layer 610 and beneath the top surface 611 of the absorption layer 610. In some embodiments, the first doped region 631 and the second doped region 641 are carrier collection regions, which are configured to collect a major portion of photo-carriers generated by the absorption layer 610.

In some embodiments, the first doped region 631 is of a first conductivity type. The third doped region 632 is of a third conductivity type. The second doped region 641 is of a second conductivity type. The fourth doped region 642 is of a fourth conductivity type. The first conductivity type, the third conductivity type, the second conductivity type, and the fourth conductivity type are the same, for example, are n type.

In some embodiments, the first doped region 631 includes a first dopant having a first peak doping concentration. In some embodiments, the third doped region 632 includes a third dopant having a third peak doping concentration. In some embodiments, the second doped region 641 includes a second dopant having a second peak doping concentration. In some embodiments, the fourth doped region 642 includes a fourth dopant having a fourth peak doping concentration. The first peak doping concentration, the third peak doping concentration, the second peak doping concentration, and the fourth peak doping concentration can be, for example, between $1\times10^{19}$ cm$^{-3}$ to $5\times10^{21}$ cm$^{-3}$.

Referring to FIG. 6, in some embodiments, the first counter-doped region 650 surrounds a portion of the first doped region 631. In some embodiments, the second counter-doped region 651 surrounds a portion of the second doped region 641. The first counter-doped region 650 and the second counter-doped region 651 are dark-current reduction regions made for reducing the dark current of the photo-detecting device. In some embodiments, the first counter-doped region 650 is of a conductivity type different from the first conductivity type of the first doped region 631. In some embodiments, the first counter-doped region 650 includes a fifth dopant having a fifth peak doping concentration. The fifth peak doping concentration is not less than $1\times10^{16}$ cm$^{-3}$. In some embodiment, the fifth peak doping concentration of the first counter-doped region 650 is lower than the first peak doping concentration of the first doped region 631. In some embodiments, the fifth peak doping concentration is between $5\times10^{18}$ cm$^{-3}$ and $5\times10^{20}$ cm$^{-3}$. In some embodiments, the second counter-doped region 651 includes a sixth dopant having a sixth peak doping concentration. The sixth peak doping concentration of the second counter-doped region 651 is not less than $1\times10^{16}$ cm$^{-3}$. In some embodiment, the sixth peak doping concentration of the second counter-doped region 651 is lower than the second peak doping concentration of the second doped region 641. In some embodiments, the sixth peak doping concentration is between $5\times10^{18}$ cm$^{-3}$ and $5\times10^{20}$ cm$^{-3}$. In some embodiments, if the photo-detecting device is configured to collect electrons, the first dopant, the third dopant, the second dopant and the fourth dopant include an n-type dopant. The fifth dopant and the sixth dopant include a p-type dopant. In some embodiments, the first dopant, the third dopant, the second dopant and the fourth dopant are the same. In some embodiments, the fifth dopant and the sixth dopant are the same. In some embodiments, the p-type dopant includes a group-III element. In some embodiments, p-type dopant is boron. In some embodiments, n-type dopant includes a group-V element. In some embodiments, n-type dopant is phosphorous.

Referring to FIG. 6, in some embodiments, the first doped region 631 may include the first dopant and the fifth dopant. In some embodiments, the fifth dopant may diffuse into the first doped region 631 from the first counter-doped region 650. In some embodiments, the fifth dopant may be implanted into a part of the first doped region 631 during the step of implanting the fifth dopant to form the first counter-doped region 650. In some embodiments, the first peak doping concentration of the first dopant is higher, for example, 10 times higher than the peak doping concentration of the fifth dopant in the first doped region 631. In some embodiments, the part of the first doped region 631 near the first counter-doped region 650 includes boron and phosphorous, wherein the peak doping concentration of phosphorous is about $5\times10^{20}$ cm$^{-3}$, and the peak doping concentration of boron in the first doped region 631 is about $5\times10^{18}$ cm$^{-3}$. In some embodiments, the second doped region 641 may include the second dopant and the sixth dopant. In some embodiments, the sixth dopant may diffuse into the second doped region 641 from the second counter-doped region 651. In some embodiments, the sixth dopant may be implanted into a part of the second doped region 641 during the step of implanting the sixth dopant to form the second counter-doped region 651. In some embodiments, the second peak doping concentration of the second dopant is higher, for example, 10 times higher than the peak doping concentration of the sixth dopant in the second doped region 641. In some embodiments, the part of the second doped region 641 near the second counter-doped region 651 includes boron and phosphorous, wherein the peak doping concentration of phosphorous is about $5\times10^{20}$ cm$^{-3}$, and the peak doping concentration of boron in the second doped region 641 is about $5\times10^{18}$ cm$^{-3}$.

Referring to FIG. 6, in some embodiments, the absorption layer 610 is fully embedded in the substrate 620. In some embodiments, the top surface 611 of the absorption layer 610 is substantially flush with the first surface 621 of the substrate 620. In some embodiments, the absorption layer 610 is partially embedded in the substrate 620. In some embodiments, the first surface 621 of the substrate 620 is between the top surface 611 of the absorption layer 610 and the second surface 622 of the substrate 620. In some embodiments, the absorption layer 610 is entirely on the first surface 621 of the substrate 620, as described in FIG. 1A.

Referring to FIG. 6, in some embodiments, the photo-detecting device further includes a first readout circuit 670, a second readout circuit 671, a first control signal 672 and a second control signal 673. The first readout circuit 670 and the first control signal 672 are electrically coupled to the first switch 630. The second readout circuit 671 and the second control signal 673 are electrically coupled to the second switch 640.

The first readout circuit 670 is electrically connected to the first doped region 631. The second readout circuit 671 is electrically to the second doped region 641. The first control signal 672 is electrically coupled to the first gate electrode 633. The second control signal 673 is electrically coupled to the second gate electrode 643. The first readout circuit 670, the second readout circuit 671, the first control signal 672, and the second control signal 673 are similar to the first readout circuit 370, the second readout circuit 371, the first control signal 372, and the second control signal 373 as described in FIG. 3A.

In some embodiments, when the first gate electrode 633 includes the first contact layer 6331 Schottky contacting to the absorption layer 610, the first switch 630 is referred as a first MESFET (metal semiconductor field effect transistor). In some embodiments, when the second gate electrode 643 includes the second contact layer 6431 Schottky contacting to the absorption layer 610, the second switch 640 is referred as a second MESFET.

In some embodiments, the first switch 630 is referred as a first MOSFET, the second switch 640 is referred as a second MOSFET. In some embodiments, the first switch 630 is referred as a first nMOSFET, the second switch 640 is referred as a second nMOSFET. In some embodiments, during the operation of the photo-detecting device configured to collect electrons, an incident light enters into the absorption layer 610, for example, from the second surface 622 of the substrate 620, and then is absorbed by the absorption layer 610 to generate photo-carriers including electrons and holes. When switching on the first switch 630 by the first control signal 672, the first gate electrode 633 receives a first voltage (e.g. 1V) higher than a threshold voltage, and the second gate electrode 643 receives a second voltage (e.g. 0V) lower than the first voltage and the threshold voltage. The electrons of the photo-carriers are driven to move toward the first gate electrode 633 and an n-channel is formed beneath the first insulating layer 6332 to electrically coupled the third doped region 632 and the first doped region 631, and thus electrons can flow through the channel. A major portion of the electrons of the photo-carriers are driven to move toward the first doped region 631 to be collected. Alternately, when switching on the second switch 640 by the second control signal 673, the first gate electrode 633 receives a third voltage (e.g. 0V) lower than the threshold voltage, and the second gate electrode 643 receives a fourth voltage (e.g. 1V) higher than the threshold voltage and the third voltage. The electrons of the photo-carriers are driven to move toward the second gate electrode 643 and an n-channel is formed beneath the second insulating layer 6432 and to electrically coupled the fourth doped region 642 and the second doped region 641, and thus electrons can flow through the channel. A portion of the electrons of the photo-carriers are driven to move toward the second doped region 641 to be collected.

In some embodiments, the substrate 620 may be coupled to an external control signal (not shown). For example, the substrate 620 may be coupled to an electrical ground, or a preset voltage less than the voltages at the first doped region 631 and the second doped region 641 if the photo-detecting device is configured to collect electrons. In some embodiments, the substrate 620 may be floated and not coupled to any external control signal.

Compared to a photo-detecting device devoid of a first counter-doped region 650 surrounding the first doped region 631 and a second counter-doped region 651 surrounding the second doped region 641, the photo-detecting device including the first counter-doped region 650 surrounding the first doped region 631 and including the second counter-doped region 651 surrounding the second doped region 641 has a thinner depletion region around the first doped region 631 and a thinner depletion region around the second doped region 641, and the two depletion regions do not touch the bottom surface 612 of the absorption layer 610. Accordingly, the photo-detecting device is with lower dark current. Besides, with the first switch 630 and the second switch 640 integrated with a single absorption layer 610, the photo-detecting device is with both improved demodulation contrast and lower dark current.

Figure 7A:
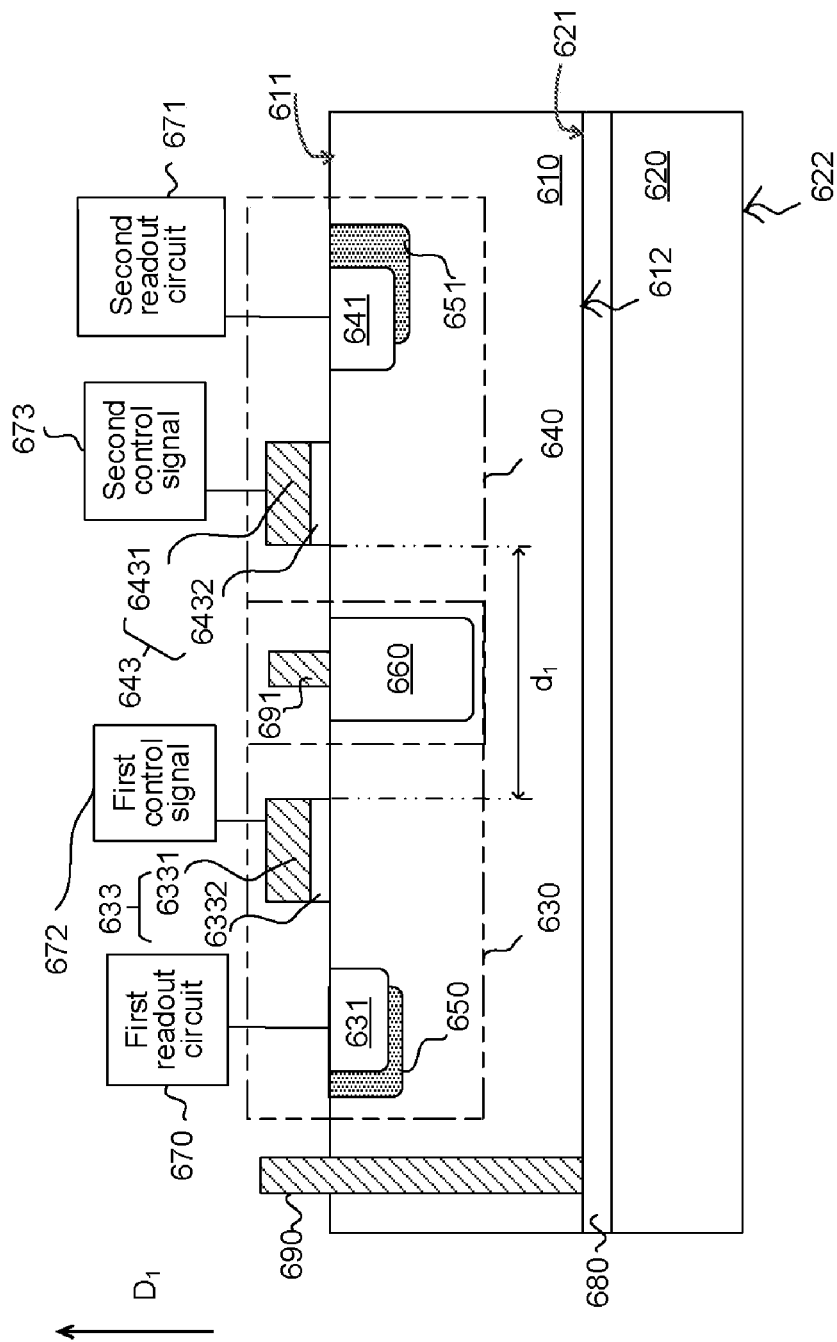
FIG. 7A illustrates a cross-sectional view of a semiconductor device, according to some embodiments.

FIG. 7A illustrates a cross-sectional view of a semiconductor device, according to some embodiments. The semiconductor device in FIG. 7A is similar to the semiconductor device in FIG. 6, the difference is described below. In some embodiments, the absorption layer 610 is on the substrate 620. In some embodiments, the third doped region 632 and the fourth doped region 642 illustrated in FIG. 6 are merged into a common region 660. The common region 660 is between the first gate electrode 633 and the second gate electrode 643. The first switch 630 includes the first doped region 631, the first gate electrode 633 and the common region 660. The second switch 640 includes the second doped region 641, the second gate electrode 643 and the common region 660. The common region 660 is of a conductivity type the same as the first conductivity type of the first doped region 631 and the second conductivity type of the second doped region 641. In some embodiments, the common region 660 includes a dopant having a peak doping concentration such as between $1 \times 10^{19}$ cm$^{-3}$ to $5 \times 10^{21}$ cm$^{-3}$. In some embodiments, the dopant of the common region 660 is n-type.

In some embodiments, the photo-detecting device further includes a first zone 680 in the substrate 620. The first zone 680 is beneath the first surface 621 of the substrate 620. The first zone 680 is opposite to the second doped region 641, the common region 660 and the first doped region 631. In some embodiments, a vertical electric field is formed between the first zone 680 and the common region 660. In some embodiments, the first zone 680 is overlapped with the common region 660 along a vertical direction Dl. In some embodiments, the first zone 680 includes a dopant and is of a conductivity type. In some embodiments, the conductivity type of the first zone 680 is different from the conductivity type of the common region 660. In some embodiments, the dopant of the first zone 680 includes a peak doping concentration between $1 \times 10^{17}$ cm$^{-3}$ and $5 \times 10^{20}$ cm$^{-3}$. In some embodiments, the peak doping concentration of the first zone 680 is not more than $1\times10^{19}$ cm$^{-3}$. In some embodiment, the common region 660, the absorption layer 610 and the first zone 680 are referred as a vertical photodiode. When two different voltages are applied to the first gate electrode 633 and the second gate electrode 643 in connection with the first zone 680, depletion region between the first zone 680 and the common region 660 is expanded. Therefore, the quantum efficiency of the photo-detecting device is higher and the amount of the carriers directed to the first doped region 631 or second doped region 641 is also higher. Furthermore, by forming the first counter-doped region 650 and the second counter-doped region 651, the photo-detecting device has a thinner depletion region around the first doped region 631 and a thinner depletion region around the second doped region 641. Accordingly, the photo-detecting device is with both higher quantum efficiency and lower dark current. In some embodiments, a distance $d_1$ is between the first gate electrode 633 and the second gate electrode 643. A ratio of the distance $d_1$ to the thickness of the absorption layer 610 is between 0.8 and 1.2 (both included). By controlling the relation between the distance $d_1$ to the thickness of the absorption layer 610, the photo-detecting device is with improved demodulation contrast.

In some embodiments, the photo-detecting device further includes a third contact layer 690 penetrating through the absorption layer 610. The third contact layer 690 is electrically coupled to the first zone 680 to discharge the photo-carriers with opposite type and not collected by the first doped region 631 or the second doped region 641 during the operation of the photo-detecting device to improve the reliability of the photo-detecting device. In some embodiments, the third contact layer 690 is in direct contact with the first zone 680. In some embodiments, the third contact layer 690 includes metal including, but is not limited to, copper, aluminum, or tungsten. In some embodiments, the photo-detecting device further includes an external source (not shown) electrically coupled to the first zone 680. In some embodiments, when the photo-detecting device is configured to collects electrons, during the operation of the photo-detecting device, the external source includes an electrical ground, or provides a preset voltage less than the voltage at the first doped region 631 and the voltage at second doped region 641 to discharge holes. In some embodiments, the first zone 680 is not coupled to any external control signal and thus is floated.

In some embodiments, the photo-detecting device further includes a fourth contact layer 691 electrically coupled to the common region 660. In some embodiments, the common region 660 is not coupled to any external control signal and thus is floated. The floated common region 660 reduces leakage current between the common region 660 and the first doped region 631 or reduces the leakage current between the common region 660 and the second doped region 641 during the operation of the photo-detecting device. In some embodiments, the common region 660 is electrically connected to an external source.

In some embodiments, when the photo-detecting device is operated, an incident light is absorbed by the absorption layer 610 and photo-carriers including electrons and holes are then generated. Two different voltages are applied to the first gate electrode 633 and the second gate electrode 643 to form a channel beneath the first insulating layer 6332 or the second insulating layer 6432 to allow the photo-carriers to flow through. Holes or electrons of the photo-carriers are driven to move toward the first doped region 631 or the second doped region 641 through the channel and then are collected. In the present disclosure, in a same photo-detecting device, the type of the carriers collected by the first doped region 631 and the type of the carriers collected by the second doped region 641 are the same. For example, when the photo-detecting device is configured to collects electrons, when the first switch 630 is switched on and the second switch 640 is switched off, the first doped region 631 collects electrons of the photo-carriers, and when the second switch 640 is switched on and the first switch 630 is switched off, the second doped region 641 also collects electrons of the photo-carriers.

In some embodiments, the first switch 630 is referred as a first MOSFET, the second switch 640 is referred as a second MOSFET. The photo-detecting device is configured to collects electrons. The substrate 620 includes silicon, the absorption layer 610 includes intrinsic germanium, the common region 660, the first doped region 631 and the second doped region 641 include n-type germanium. For example, the common region 660, the first doped region 631 and the second doped region 641 includes germanium doped with phosphorous having a peak doping concentration between $1\times10^{19}$ cm$^{-3}$ and $5\times10^{20}$ cm$^{-3}$. The first counter-doped region 650 and the second counter-doped region 651 includes germanium doped with phosphorous having a peak doping concentration between $1\times10^{18}$ cm$^{-3}$ and $1\times10^{19}$ cm$^{-3}$. During the operation of the photo-detecting device, an incident light enters into the absorption layer 610 from the second surface 622 of the substrate 620, and then is absorbed by the absorption layer 610 to generate photo-carriers including electrons and holes. In some embodiments, The first zone 680 is operated at a first voltage (e.g. 0V), when switching on the first switch 630 by the first control signal 672, the first gate electrode 633 receives a second voltage (e.g. 1V) higher than a threshold voltage, and the second gate electrode 643 receives a third voltage (e.g. 0V) lower than the second voltage and the threshold voltage. The common region 660 may be operated at a fourth voltage higher than the first voltage. An n-channel is then formed beneath the first insulating layer 6332 to electrically coupled the common region 660 and the first doped region 631 to allow the electrons to flow through. A portion of the electrons of the photo-carriers are driven to move toward the first doped region 631 to be collected. Alternately, when switching on the second switch 640 by the second control signal 673, the first gate electrode 633 receives a fifth voltage (e.g. 0V) lower than the threshold voltage, and the second gate electrode 643 receives a six voltage (e.g. 1V) higher than the fifth voltage and the threshold voltage. An n-channel is formed beneath the second insulating layer 6432 and to electrically coupled the common region 660 and the second doped region 641 to allow the electrons to flow through. A portion of the electrons of the photo-carriers are driven to move toward the second doped region 641 to be collected.

Compared to a photo-detecting device devoid of a first counter-doped region 650 surrounding the first doped region 631 and a second counter-doped region 651 surrounding the second doped region 641, the photo-detecting device including the first counter-doped region 650 surrounding the first doped region 631 and including the second counter-doped region 651 surrounding the second doped region 641 has a thinner depletion region around the first doped region 631 and a thinner depletion region around the second doped region 641, and the two depletion regions do not touch the bottom surface 612 of the absorption layer 610. Accordingly, the photo-detecting device is with lower dark current. Besides, with the first switch 630 and the second switch 640 integrated with a single absorption layer 610, and with the vertical electric field between the first zone 680 and the common region 660, the carriers can be substantially gathered toward the common region 660 first and then move toward the first doped region 631 or the second doped region 641 by turning on the first switch 630 or the second switch 640. Accordingly, the photo-detecting device is with both improved demodulation contrast and lower dark current.

Figure 7B:
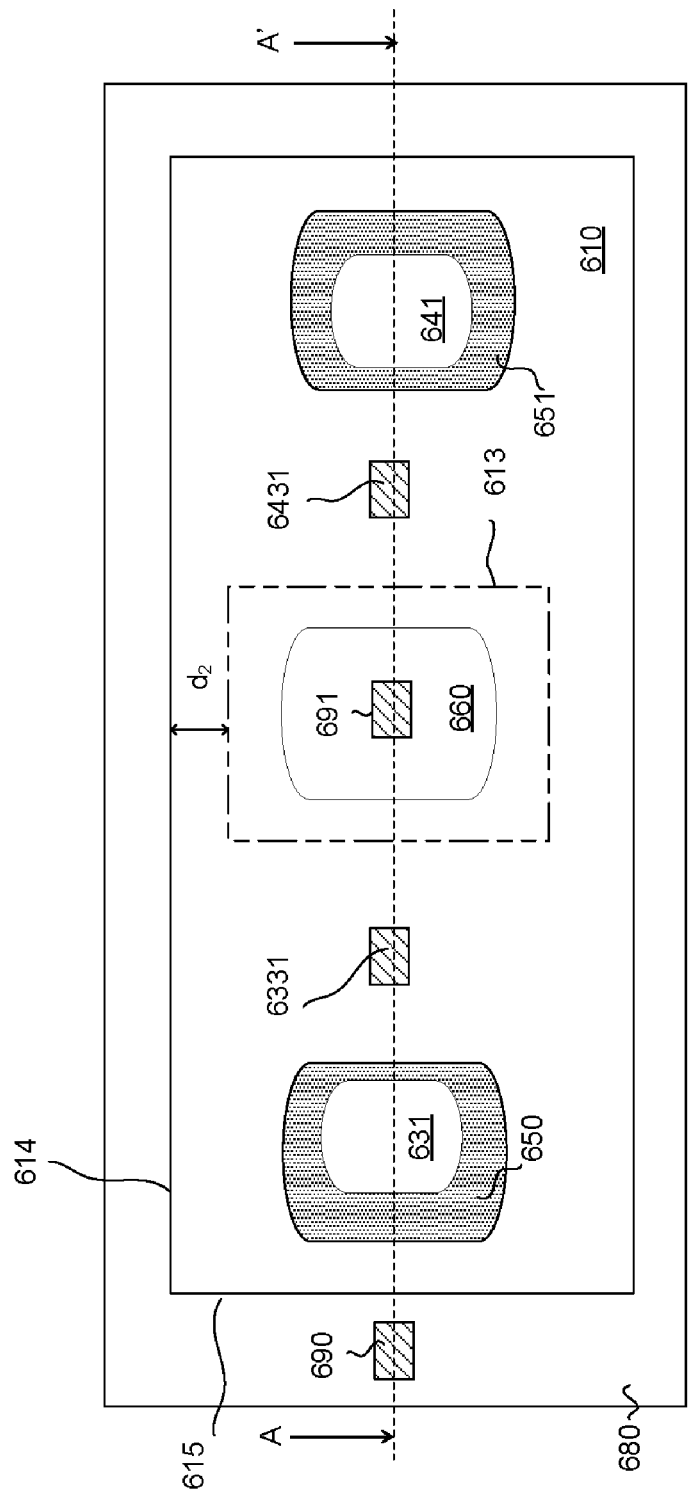
FIG. 7B illustrates a top view of a semiconductor device, according to some embodiments.
Figure 7C:
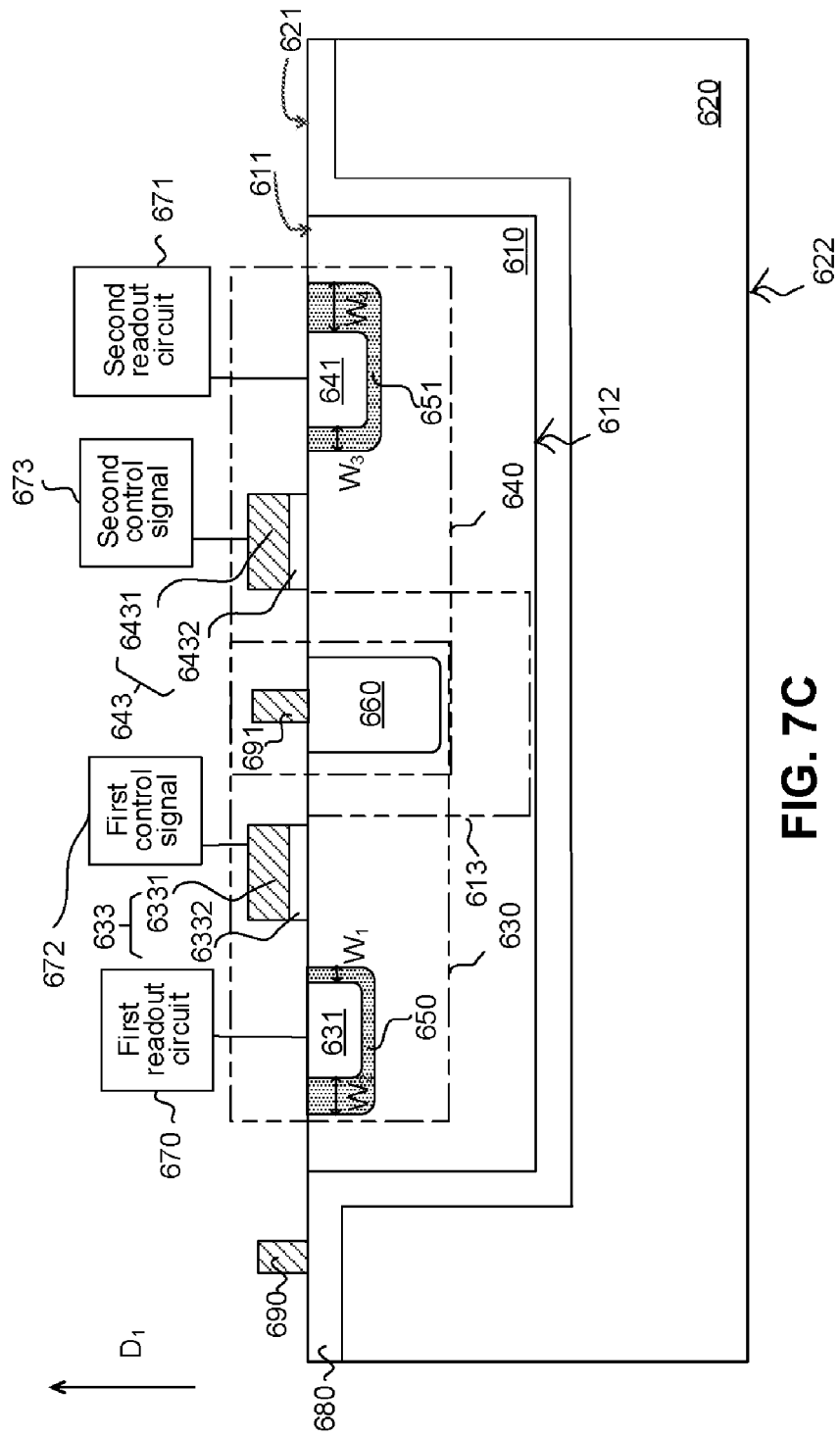
FIG. 7C illustrates a cross-sectional view of the semiconductor device dissecting along line AA' of FIG. 7B.

FIG. 7B is a top view of a semiconductor device, according to some embodiments. FIG. 7C is a cross-sectional view of the semiconductor device dissecting along line AA' of FIG. 7B. The semiconductor device is a photo-detecting device. FIG. 7B and FIG. 7C are similar to the semiconductor device in FIG. 7A, the difference is described below. The absorption layer 610 is fully embedded in the substrate 620. In some embodiments, the top surface 611 of the absorption layer 610 is substantially flush with the first surface 621 of the substrate 620. In some embodiments, the first zone 680 surrounds the absorption layer 610. In some embodiments, a part of the first zone 680 extends to reach the first surface 621 of the substrate 620. That is, a part of the first zone 680 is beneath the first surface 621 of the substrate 620. In some embodiments, the first counter-doped region 650 entirely surrounds the first doped region 631. In some embodiments, the first counter-doped region 650 is an asymmetric profile surrounding the first doped region 631 from the cross-sectional view of the photo-detecting device. In some embodiments, the first counter-doped region 650 includes a first portion (not labeled) and a second portion (not labeled). The first portion is closer to the first gate electrode 633 than the second portion. The first portion has a first width $W_1$, and the second portion has a second width $W_2$ greater than the first width $W_1$. In some embodiments, the second counter-doped region 651 entirely surrounds the second doped region 641. In some embodiments, the second counter-doped region 651 is an asymmetric profile surrounding the second doped region 641 from the cross-sectional view of the photo-detecting device. In some embodiments, the second counter-doped region 651 includes a first portion (not labeled) and a second portion (not labeled). The first portion is closer to the second gate electrode 643 than the second portion. The first portion of the second counter-doped region 651 has a third width $W_3$, and the second portion has a fourth width $W_4$ greater than the third width $W_3$.

In some embodiments, the absorption layer 610 includes a detection region 613 similar to the detection region 113 in FIG. 1A and the detection region 313 FIG. 3A. In some embodiments, the absorption layer 610 includes a first sidewall 614 and a second sidewall 615. The first sidewall 614 includes a width greater than a width of the second sidewall 615. A minimum distance $d_2$ between the first sidewall 614 and the detection region 613 is between 0 um and 1 um. The peak doping concentration of the first zone 680 is not less than $1 \times 10^{17}$ cm$^{-3}$ and is not more than $1 \times 10^{19}$ cm$^{-3}$. By controlling the concentration of the first zone 680 and the minimum distance $d_2$ between the first sidewall 614 and the detection region 613, the leakage current between the part of the absorption layer 610 under the first contact layer 6331 and the part of the absorption layer 610 under the second contact layer 6431 is reduced.

In some embodiments, the photo-detecting device may be devoid of the first insulating layer 6332 between the absorption layer 610 and the first contact layer 6331. In some embodiments, the photo-detecting device may further include a third doped region 332 as described in FIG. 3A. In some embodiments, the photo-detecting device may be devoid of the second insulating layer 6432 between the absorption layer 610 and the second contact layer 6431. In some embodiments, the photo-detecting device may include a fourth doped region 342 as described in FIG. 3A.

In some embodiments, the photo-detecting device in FIG. 7A, 7B or 7C can also include the fifth doped region 480 and the sixth doped region 481 as described in FIG. 4. For example, the first doped region 631 and the first counter-doped region 650 are between the fifth doped region 480 and the first gate electrode 633. The fifth doped region 480 is between the first counter-doped region 650 and the first zone 680. In some embodiments, the second doped region 641 and the second counter-doped region 651 are between the sixth doped region 481 and the second gate electrode 643. The sixth doped region 481 is between the second counter-doped region 651 and the first zone 680.

Figure 7D:
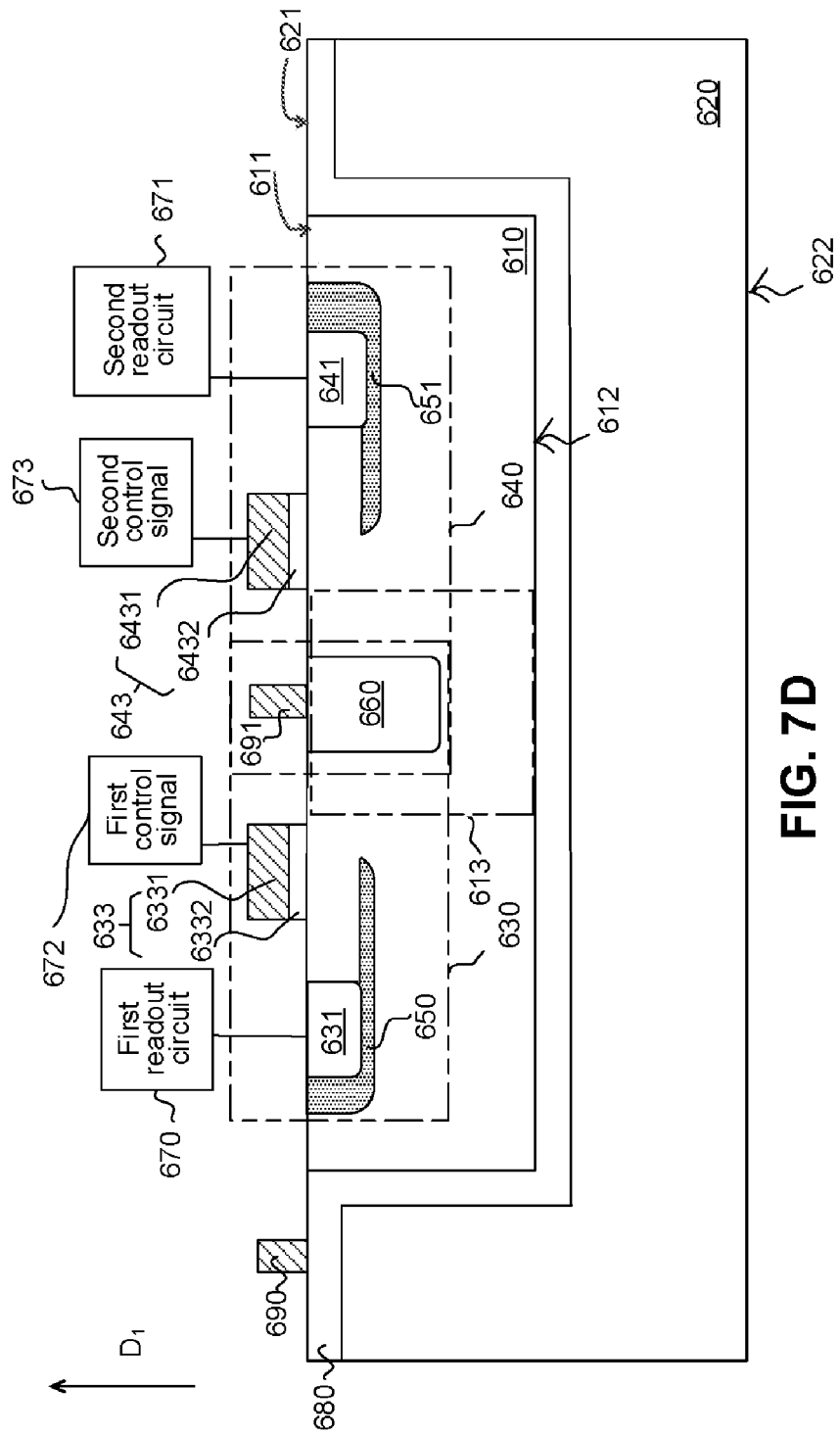
FIG. 7D illustrates a cross-sectional view of a semiconductor device, according to some embodiments.

FIG. 7D illustrates a cross-sectional view of a semiconductor device, according to some embodiments. The semiconductor device is a photo-detecting device. FIG. 7D is similar to the semiconductor device in FIG. 7B, the difference is described below. A portion of the first counter-doped region 650 extends toward the common region 660 and is overlapped with the first gate electrode 633 along the vertical direction Dl. In some embodiments, the first counter-doped region 650 does not overlap with the detection region 613. In some embodiments, a portion of the first doped region 631 near the first gate electrode 633 is not surrounded by the first counter-doped region 650. A portion of the second counter-doped region 651 extends toward the common region 660 and is overlapped with the second gate electrode 643 along the vertical direction Dl. In some embodiments, the second counter-doped region 651 does not overlap with the detection region 613. In some embodiments, a portion of the second doped region 641 near the second gate electrode 643 is not surrounded by the second counter-doped region 651.

Figure 8:
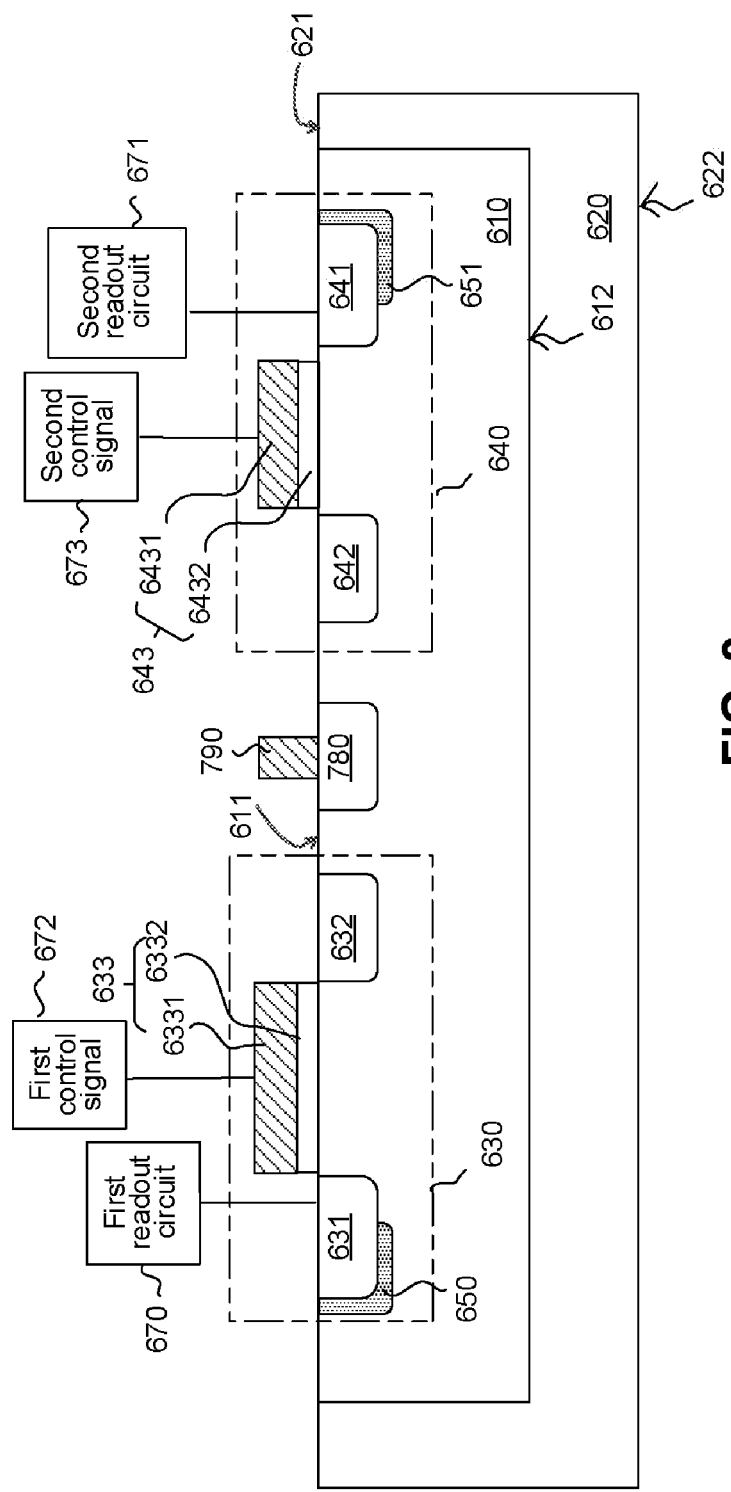
FIG. 8 illustrates a cross-sectional view of a semiconductor device, according to some embodiments.

FIG. 8 illustrates a cross-sectional view of a semiconductor device, according to some embodiments. The semiconductor device is a photo-detecting device. The photo-detecting device in FIG. 8 is similar to the photo-detecting device in FIG. 6. The difference is described below. The photo-detecting device includes a first zone 780 and a third contact layer 790. The first zone 780 is in the absorption layer 610. In some embodiments, the first zone 780 is beneath the top surface 611 of the absorption layer 610. The first zone 780 is of a conductivity type different from the third conductivity type of the third doped region 632 and the fourth conductivity type of the fourth doped region 642. In some embodiments, the absorption layer 610 is intrinsic. The third doped region 632, the absorption layer 610 and the first zone 780 are referred as a first lateral photodiode. In some embodiments, the fourth doped region 642, the absorption layer 610 and the first zone 780 are referred as a second lateral photodiode. In some embodiments, the first lateral photodiode and the second lateral photodiode are both homojunction diodes.

In some embodiments, the first switch 630 is referred as a first MOSFET. The second switch 640 is referred as a second MOSFET. In some embodiments, the third doped region 632 is one end of the first MOSFET, and one end of the first lateral photodiode. In some embodiments, the fourth doped region 642 is one end of the second MOSFET, and one end of the second lateral photodiode. In some embodiments, the first MOSFET, the second MOSFET, the first lateral photodiode and the second lateral photodiode are integrated with a single absorption layer 610. For example, when the first doped region 631, the third doped region 632, the second doped region 641 and the fourth doped region 642 are of n-type, and the first zone 780 is of p-type, the third doped region 632 is the n terminal of the first lateral photodiode, and the source of the first MOSFET. The fourth doped region 642 is the n terminal of the second lateral photodiode, and the source of the second MOSFET. The first zone 780 is the p terminal of the first lateral photodiode and the p terminal of the second lateral photodiode.

The operating method of the photo-detecting device in FIG. 8 is similar to the operating method of the photo-detecting device disclosed in FIG. 6. The difference is described below. In some embodiments, during the operation of the photo-detecting device configured to collect electrons, when an incident light L is absorbed by an area between the first zone 780 and the third doped region 632 to generate photo-carriers including electrons and holes. The first switch 630 is switched on to collect a major portion of the electrons of the photo-carriers. Since the area generating photo-carriers is closer to the first switch 630 that is switched on, the photo-detecting device is with improved demodulation contrast. Similarly, when an incident light L is absorbed by an area between the first zone 780 and the fourth doped region 642 to generate photo-carriers including electrons and holes. The second switch 640 is switched on to collect a major portion of the electrons of the photo-carriers. Since the area generating photo-carriers is closer to the second switch 640 that is switched on, the photo-detecting device is with improved demodulation contrast. Furthermore, by forming the first counter-doped region 650 and the second counter-doped region 651, the photo-detecting device has a thinner depletion region around the first doped region 631 and a thinner depletion region around the second doped region 641. Accordingly, the photo-detecting device is with both higher demodulation contrast and lower dark current.

In some embodiments, the photo-detecting device in FIG. 8 can also include the fifth doped region 480 and the sixth doped region 481 as described in FIG. 4.

Figure 9A:
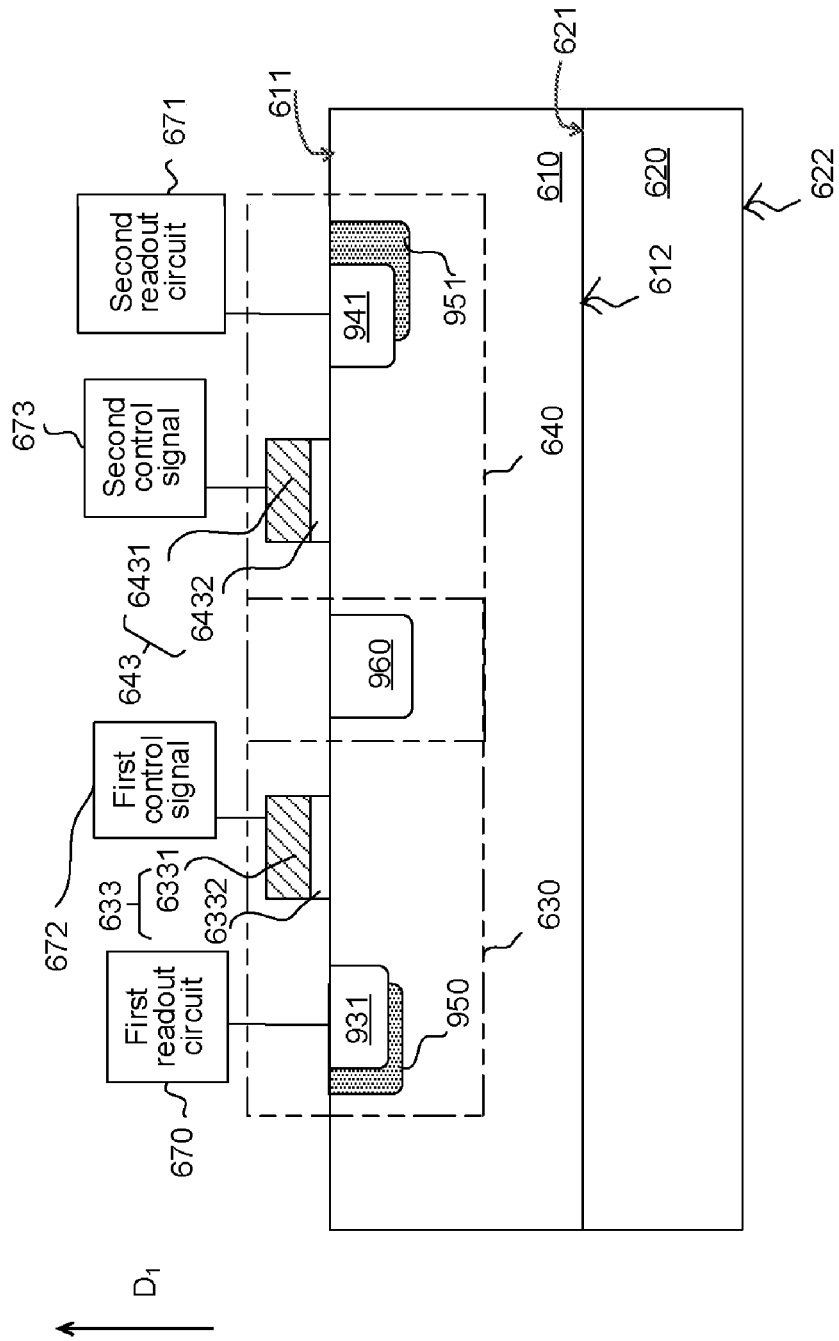
FIG. 9A illustrates a cross-sectional view of a semiconductor device, according to some embodiments.

FIG. 9A illustrates a cross-sectional view of a semiconductor device, according to some embodiments. The semiconductor device is a photo-detecting device. The photo-detecting device in FIG. 9A is similar to the photo-detecting device in FIG. 7. The difference is described below. The first conductivity type of the first doped region 931 is different from the conductivity type of the common region 960. The second conductivity type of the second doped region 941 is different from the conductivity type of the common region 960. In some embodiments, the common region 960 and the first doped region 931 are referred as a first lateral photodiode. In some embodiments, the common region 960 and the second doped region 941 are referred as a second lateral photodiode. In some embodiments, the first lateral photodiode is a homojunction diode. The second lateral photodiode is a homojunction diode. In some embodiments, the first switch 630 and the second switch 640 are integrated with a single absorption layer 610, and thus the photo-detecting device is with improved demodulation contrast. In some embodiments, the first gate electrode 633 includes the first insulating layer 6332 between the first contact layer 6331 and the absorption layer 610, and the second gate electrode 643 includes the second insulating layer 6432 between the first contact layer 6331 and the absorption layer 610.

In some embodiments, when the photo-detecting device in FIG. 9A is operated, an incident light is absorbed by the absorption layer 610 and photo-carriers including electrons and holes are then generated. Two different voltages are applied to the first gate electrode 633 and the second gate electrode 643 to form an inversion area beneath the first insulating layer 6332 or beneath the second insulating layer 6432. However, since the first conductivity type of the first doped region 931 and the second conductivity type of the second doped region 941 are different from the conductivity type of the common region 960, the first switch 630 with the inversion area formed or the second switch 640 with the inversion area formed does not allow the carries to flow through. Instead, since the depletion region is smaller compared to the other switch without the inversion area formed, a major portion of holes or electrons of the photo-carriers are driven to move toward the first doped region 931 or the second doped region 941 by the electric field in the larger depletion region. For example, when two different voltages are applied to the first gate electrode 633 and the second gate electrode 643 to form an inversion area beneath the first insulating layer 6332, the depletion region between the common region 960 and the first doped region 931 is smaller than the depletion region between the common region 960 and the second doped region 941, and thus a major portion of holes or electrons of the photo-carriers are driven by a larger electric field to move toward the second doped region 941. For another example, when two different voltages are applied to the first gate electrode 633 and the second gate electrode 643 to form an inversion area beneath the second insulating layer 6432, the depletion region between the common region 960 and the first doped region 931 is larger than the depletion region between the common region 960 and the second doped region 932, and thus a major portion of holes or electrons of the photo-carriers are driven by a larger electric field to move toward the first doped region 931. By forming an inversion layer to generate different sizes of depletion regions at two opposite sides of the common region 960, a major portion of the carriers are driven to move toward a direction opposite to the inversion layer.

Referring to FIG. 9A, in some embodiments, the first counter-doped region 950 surrounds a portion of the first doped region 931 father from the second doped region 941. In some embodiments, the second counter-doped region 951 surrounds a portion of the second doped region 941 father from the first doped region 931. In some embodiments, the first doped region 931, the second doped region 941, and the common region 960 are between the first counter-doped region 950 and the second counter-doped region 951 from a cross-sectional view of the photo-detecting device. By forming the first counter-doped region 950 surrounds a portion of the first doped region 931 and the second counter-doped region 951 surrounding a portion of the second doped region 941, the depletion region at the portion of the first doped region 931 father from the second doped region 941 and the depletion region at the second doped region 941 father from the first doped region 931 are thinner. Accordingly, the photo-detecting device is with lower dark current.

During the operation of the photo-detecting device configured to collects electrons, the absorption layer 610 may be at a first voltage V1 (e.g. 3 V), and the common region 960 may be at a second voltage (e.g. 0V) lower than the first voltage. An incident light enters into the absorption layer 610 for example, from the second surface 622 of the substrate 620, and then is absorbed by the absorption layer 610 to generate photo-carriers including electrons and holes. The first gate electrode 633 receives a third voltage (e.g. 0V), and the second gate electrode 643 receives a fourth voltage (e.g. 1V) higher than the third voltage. The holes of the photo-carriers are driven to move toward the first gate electrode 633 and an inversion area is formed beneath the first insulating layer 6332. Since the inversion area is formed, the depletion region between the first doped region 931 and the common region 960 is smaller than the depletion region between the second doped region 941 and the common region 960. A major portion of the electrons of the photo-carriers are then driven to move toward the second doped region 941 by the stronger electric field. Alternately, the first gate electrode 633 receives a fifth voltage (e.g. 1V) and the second gate electrode 643 receives a six voltage (e.g. 0V) lower than the fifth voltage. The holes of the photo-carriers are driven to move toward the second gate electrode 643 and an inversion area is formed beneath the second insulating layer 6432. Since the inversion area is formed, the depletion region between the second doped region 941 and the common region 960 is smaller than the depletion region between the first doped region 931 and the common region 960. A major portion of the electrons of the photo-carriers are then driven to move toward the first doped region 931 by the stronger electric field.

In some embodiments, when the photo-detecting device is operated above a voltage to occur an avalanche breakdown between the common region 960 and the first doped region 931 or between the common region 960 and the second doped region 941, which results a large number of secondary carriers generated by impact ionization. The secondary carriers are then collected by the first doped region 931 or the second doped region 941. Therefore, the photo-detecting device is with an internal gain and also with lower dark current since including the second counter-doped region 951 and the first counter-doped region 950.

Figure 9B:
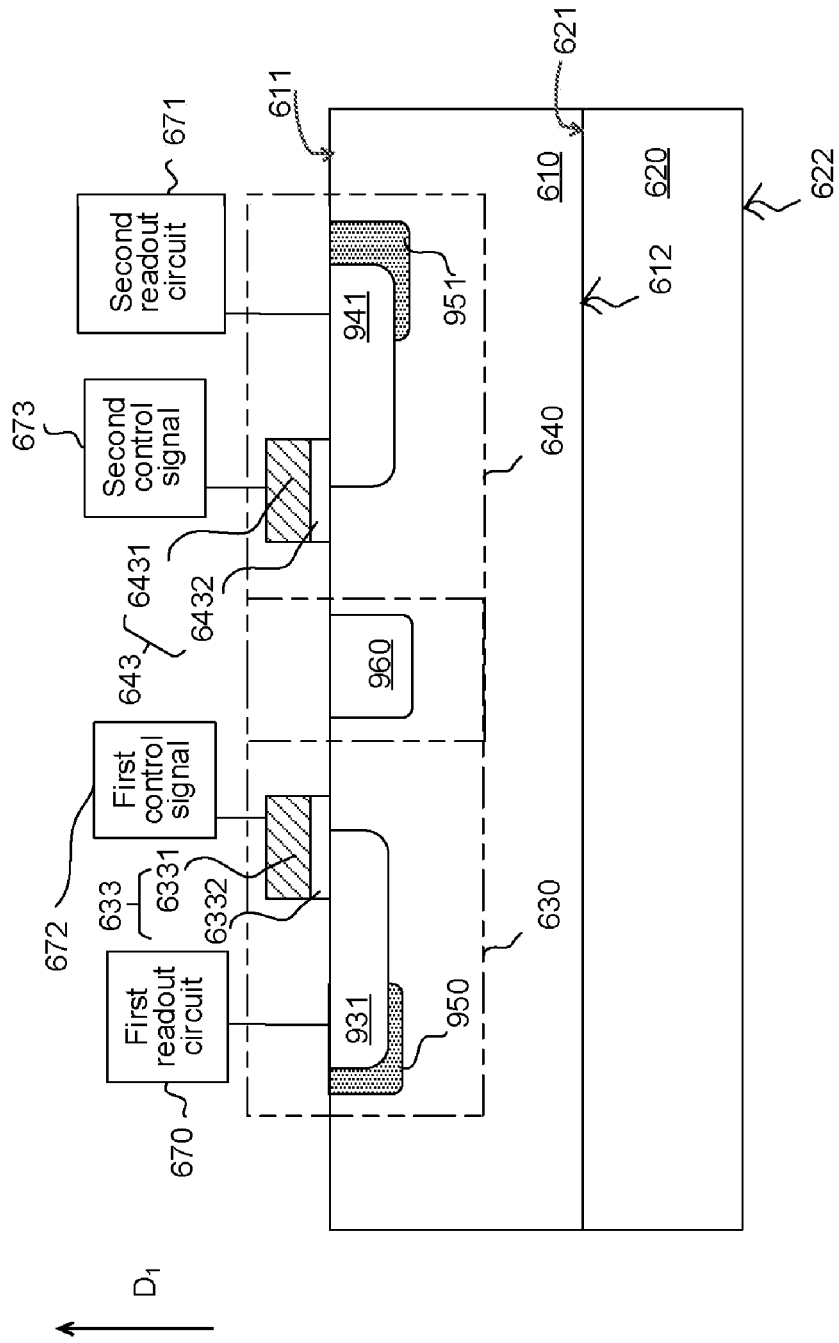
FIG. 9B illustrates a cross-sectional view of a semiconductor device, according to some embodiments.

FIG. 9B illustrates a cross-sectional view of a semiconductor device, according to some embodiments. The semiconductor device is a photo-detecting device. The photo-detecting device in FIG. 9B is similar to the photo-detecting device in FIG. 9A, the difference is described below. In some embodiments, the first gate electrode 633 is overlapped with the first doped region 631 along a vertical direction Dl for a higher chance to occur avalanche breakdown during the operation of the photo-detecting device. In some embodiments, the second gate electrode 643 is overlapped with the second doped region 641 along a vertical direction Dl. In some embodiments, the photo-detecting device is configured to operate at a reverse bias high enough to occur avalanche breakdown so as to generate an internal gain.

Figure 10:
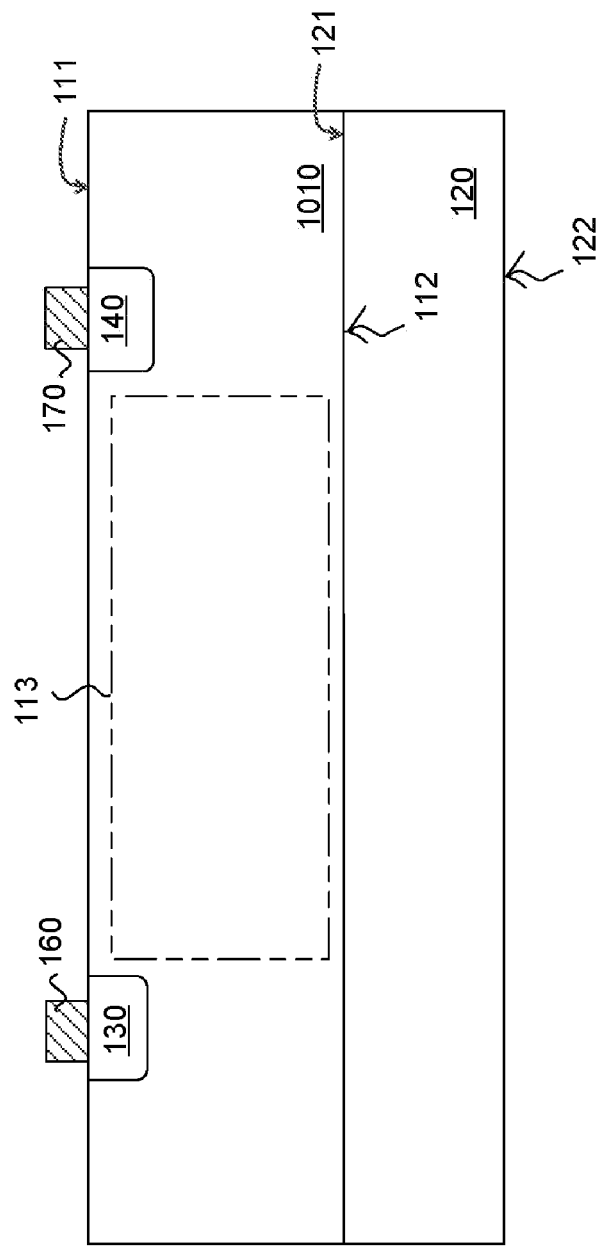
FIG. 10 illustrates a cross-sectional view of a semiconductor device, according to some embodiments.

FIG. 10 illustrates a cross-sectional view of a semiconductor device, according to some embodiments. The semiconductor device is a photo-detecting device. The photo-detecting device in FIG. 10 is similar to the photo-detecting device in FIG. 1A, the difference is described below. In some embodiments, the counter-doped region 150 adjacent to the first doped region 130 as described in FIG. 1A may be optional. In some embodiments, the photo-detecting device is devoid of the counter-doped region 150. The absorption layer 1010 is intentionally doped with a dopant and is of a conductivity type different from the first conductivity type of the first doped region 130. In some embodiments, the dopant of the absorption layer 1010 can be introduced by any suitable method, such as in-situ growth, ion implantation, or thermal diffusion.

In some embodiments, the dopant of the absorption layer 1010 has a peak doping concentration less than the first peak doping concentration of the first dopant of the first doped region 130. In some embodiments, the peak doping concentration of the dopant of the absorption layer 1010 is not less than $1\times10^{15}$ cm$^{-3}$ for reducing the dark current of the photo-detecting device. In some embodiments, the peak doping concentration is not more than $1\times10^{18}$ cm$^{-3}$. If the peak doping concentration is higher than $1\times10^{18}$ cm$^{-3}$, the quantum efficiency will drop. In some embodiments, the peak doping concentration of the dopant of the absorption layer 1010 is between $1\times10^{17}$ cm$^{-3}$ and $1\times10^{18}$ cm$^{-3}$ for further reducing the dark current and keeping a satisfied quantum efficiency of the photo-detecting device at the same time. For example, the dark current of a photo-detecting device including the absorption layer 1010 with a peak doping concentration of $1\times10^{18}$ cm$^{-3}$ is about two orders of magnitude lower compared to the dark current of the photo-detecting device including the absorption layer 1010 with a peak doping concentration of $1\times10^{15}$ cm$^{-3}$.

In some embodiments, from a concentration depth profile of the dopant of the absorption layer 1010, the concentration of the dopant along the depth direction of the absorption layer 1010 is not less than $1\times10^{15}$ cm$^{-3}$. In some embodiments, from a concentration depth profile of the dopant of the absorption layer 1010, the concentration of the dopant along the depth direction is not more than $1\times10^{18}$ cm$^{-3}$. In some embodiments, the concentration depth profile is measured from the top surface 111 to the bottom surface 112 of the absorption layer 1010. In some embodiments, at least 50% of the absorption layer 1010 has a doping concentration of the dopant not less than $1\times10^{15}$ cm$^{-3}$. In some embodiments, at least 50% of the absorption layer 1010 has a doping concentration of the dopant not more than $1\times10^{18}$ cm$^{-3}$. In other words, at least half of the absorption layer 1010 is intentionally doped with the dopant having a doping concentration not less than $1\times10^{15}$ cm$^{-3}$ and not more than $1\times10^{18}$ cm$^{-3}$. In some embodiments, at least 80% of the absorption layer 1010 is intentionally doped with the dopant having a doping concentration not less than $1\times10^{15}$ cm$^{-3}$ and not more than $1\times10^{18}$ cm$^{-3}$. By intentionally doping the absorption layer 1010 to a specific range of concentration, the photo-detecting device is with lower dark current.

In some embodiments, the absorption layer 1010 includes GeSi, Si or Ge. In some embodiments, the absorption layer 1010 is composed of germanium.

In some embodiments, the photo-detecting device in the photo-detecting system in FIG. 2 is the photo-detecting device in FIG. 10. Again, since the photo-detecting device in FIG. 10 is with lower dark current, the photo-detecting system is with higher signal-to-noise ratio.

Figure 11A:
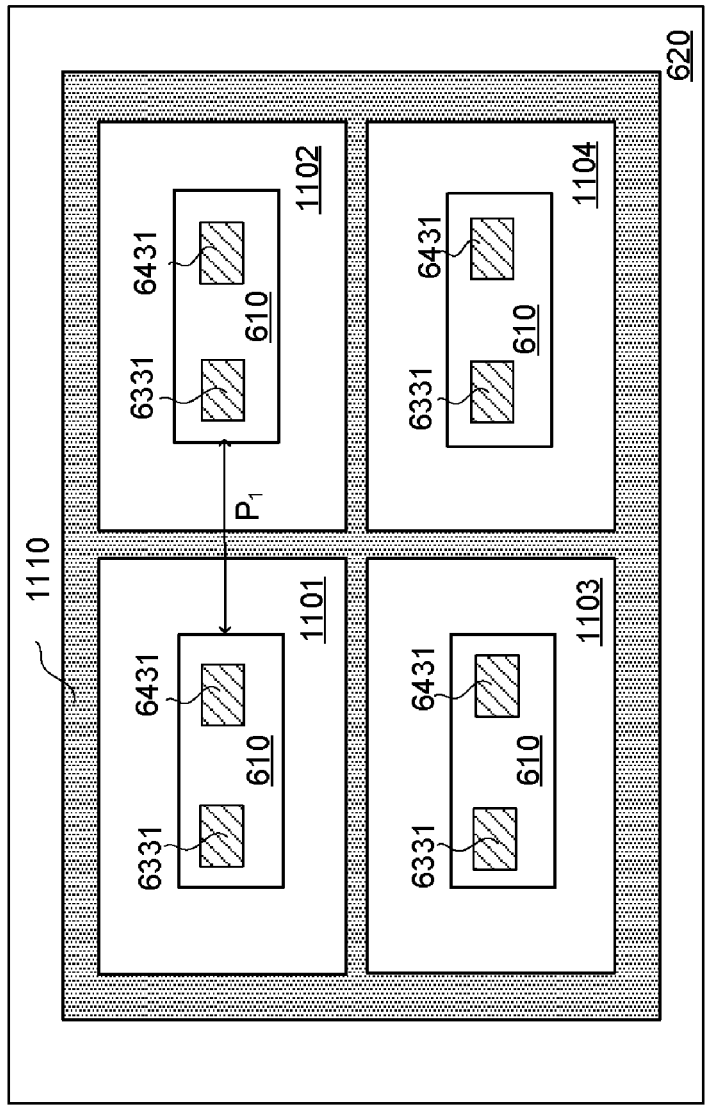
FIG. 11A illustrates a top view of a semiconductor device array, according to some embodiments.

FIG. 11A illustrates a top view of a semiconductor device array, according to some embodiments. The semiconductor device array may be a photo-detecting array. The photo-detecting array includes multiple photo-detecting devices 1101, 1102, 1103, 1104, wherein the photo-detecting device is any one of the photo-detecting devices according to the embodiments as mentioned above. The semiconductor device array may further include an isolation structure 1110 surrounding each of the photo-detecting devices 1101, 1102, 1103, 1104 such that the multiple photo-detecting devices 1101, 1102, 1103, 1104 are electrically isolated. The multiple photo-detecting devices 1101, 1102, 1103, 1104 are arranged in a one-dimensional or two-dimensional array. For example, the photo-detecting devices 1101, 1102, 1103, 1104 in FIG. 11A are any embodiment of the photo-detecting devices in FIG. 6, the photo-detecting devices 1101, 1102, 1103, 1104 share the same substrate 620, the direction from the first contact layer 6331 to second contact layer 6431 of the photo-detecting device 1101 is substantially parallel to the direction from the first contact layer 6331 to second contact layer 6431 of the photo-detecting device 1102. In some embodiments, a pitch $P_1$ is between two adjacent absorption layers 610. In some embodiments, the pitch $P_1$ is not more than 15 μm. In some embodiments, the pitch $P_1$ is not more than 3 μm.

Figure 11B:
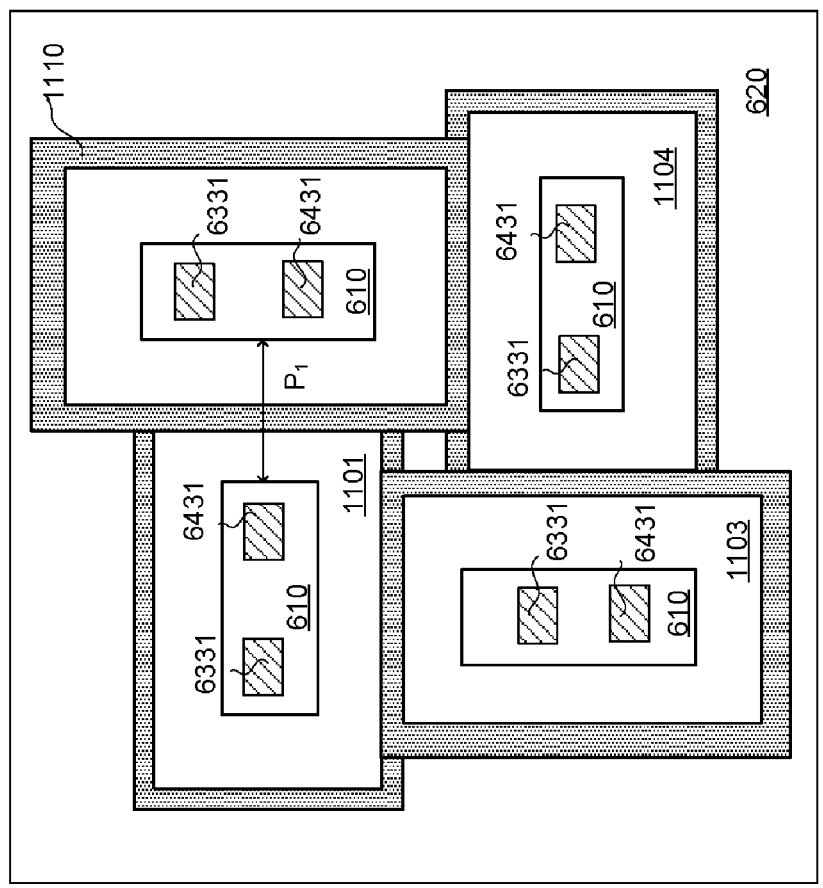
FIG. 11B illustrates a top view of a semiconductor device array, according to some embodiments.

FIG. 11B illustrates a top view of a photo-detecting array, according to some embodiments. The photo-detecting array includes four photo-detecting devices 1101, 1102, 1103, 1104. Each photo-detecting device can be implemented in accordance with any embodiment described herein. The arrangement of the photo-detecting devices in FIG. 11B is different from the arrangement of the photo-detecting devices in FIG. 11A. In some embodiments, the photo-detecting devices are arranged in a staggered arrangement as shown in FIG. 11B. In other words, the direction from the first contact layer 6331 to second contact layer 6431 of the photo-detecting device 1101 is substantially perpendicular to the direction from the first contact layer 6331 to second contact layer 6431 of the photo-detecting device 1102.

Figure 12:
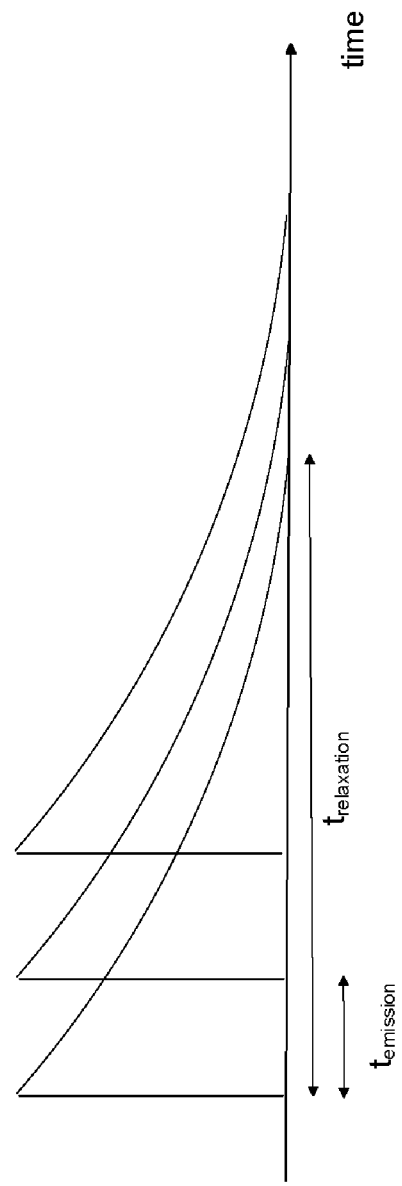
FIG. 12 is a schematic diagram showing a relation between the relaxation time and the emission time of a photo-detecting system according to some embodiments.

FIG. 12 is a schematic diagram showing a relation between the relaxation time and the emission time of a photo-detecting system, according to some embodiments. The photo-detecting system include any one of the photo-detecting devices as described before. When the photo-detecting system is in operation, the photo-detecting device absorbs photons and to generate photo-carriers from the absorbed photons. The absorption layer may include a material having a dark-carrier emission time $t_{emission}$ less than the dark-carrier emission time of the silicon. For example, the material of the absorption layer may include, but is not limited to, group IV alloy material or group III-V compound material. In some embodiments, the material of the absorption layer may include GeSn, Ge, GeSi or GaSb.

In some embodiments, the dark-carrier emission time of the material of the absorption layer is at least 10 times smaller than the dark-carrier emission time of silicon. In some embodiments, the dark-carrier emission time of the material of the absorption layer is at least 100 times smaller than the dark-carrier emission time of silicon. In some embodiments, the dark-carrier emission time of the material of the absorption layer is between 1 to 10 nanoseconds (ns). In some embodiments, the photo-detecting system includes an electrical node between the absorption layer and the first readout circuit. In some embodiments, the electrical node is between the absorption layer and the second readout circuit. The photo-detecting system may include a carrier relaxation time $t_{relaxation}$ greater than the dark-carrier emission time $t_{emission}$ so that a correlation or an interaction is introduced between the dark-carrier emission events, which in return reduces the noise associated with the dark-carrier emission, meaning the dark current noise is suppressed. The photo-detecting system includes a means for adjusting the carrier relaxation time. In some embodiments, the means is electrically coupled to the photo-detecting device. In some embodiments, the means is electrically connected to the electrical node. In some embodiments, the photo-detecting system includes multiple means for adjusting the carrier relaxation time. In some embodiments, the multiple means are electrically coupled to the photo-detecting device and/or electrically connected to the electrical node. In some embodiments, the means is capable of adjusting the carrier relaxation time such that the carrier relaxation time is longer than the dark-carrier emission time. The means includes a shunt circuit and/or a series circuit connected to the electrical node between the first readout circuit and the absorption layer and/or between the second readout circuit and the absorption layer. In some embodiments, the shunt circuit includes a capacitor that can be implemented, but is not limited to, by a MIM (metal-insulator-metal) capacitor or a FD (floating-diffusion) capacitor. In some embodiments, the series circuit includes a resistor that can be implemented by a MOSFET. In some embodiments, the shunt circuit may be coupled to an electrical ground. In some embodiments, the series circuit may be coupled to a voltage supply.

In some embodiments, the carrier relaxation time may be determined by carrier transit time, which may manifest as a function of local electric field strength. In some embodiments, the carrier relaxation time may be determined by circuit damping time, which may manifest as a function of effective RC (Resistance-Capacitance) time. In some embodiments, the carrier relaxation time may be determined by both carrier transit time and circuit damping time. In some embodiments, the dark-carrier emission time may be determined by thermal excitation rate of dark carriers in the absorption layer, which may manifest as a function of local electric field strength.

In one embodiment, the photo-detecting system includes a photo-detecting device in FIG. 6. In some embodiments, the absorption layer is composed of germanium, and the substrate is composed of silicon. The dark-carrier emission time of the absorption layer is about 5 ns. The photo-detecting system includes a first means for adjusting the carrier relaxation time, which is the capacitor of the shunt circuit coupled to the electrical node between the first readout circuit and the absorption layer, and/or between the second readout circuit and the absorption layer. The capacitor of the shunt circuit is a fixed capacitor with a capacitance about 10 femtofarad (fF). The photo-detecting system further includes a second means for adjusting the carrier relaxation time, which is the resistor of the series circuit coupled to the electrical node between the first readout circuit and the absorption layer, and/or between the second readout circuit and the absorption layer. The resistor of the series circuit is a variable resistor with a resistance greater than 0.5 MOhm (MΩ). Assuming an infinitesimally small carrier transit time, the carrier relaxation time of the photo-detecting system is then roughly determined by the circuit damping time, which is about the effective RC time constant, that is, greater than 5 ns=0.5MΩ times 10 fF. As a result, the photo-detecting system includes a carrier relaxation time greater than the dark-carrier emission time. Accordingly, the photo-detecting system is with suppressed dark current noise.

In some applications, the photo-detecting device in FIG. 3A, 3B, 4, 6-9, the photo-detecting array including the photo-detecting device in FIGS. 3A, 3B, 4, 6-9, and the photo-detecting system including the photo-detecting device in FIG. 3A, 3B, 4, 6-9 is applicable to 3D imaging, robotics, navigation system or virtual reality.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a silicon substrate; and
a germanium region formed on the silicon substrate, the germanium region comprising:

a detection region having a first side and a second side opposite to the first side, the detection region configured to receive an optical signal and generate electrical signals comprising electrons and holes;

a first doped region arranged adjacent to the first side of the detection region, wherein the first doped region is n-type and is configured to collect electrons, and wherein the first doped region is coupled to first circuitry configured to collect a portion of the electrons collected by the first doped region;

a counter-doped region at least partially surrounding the first doped region, wherein the counter-doped region is p-type; and a second doped region arranged adjacent to the second side of the detection region, wherein the second doped region is p-type and is configured to collect holes, and wherein the second doped region is coupled to an electrical ground to discharge a portion of the holes from the second doped region to the electrical ground without passing through the silicon substrate.

2. The semiconductor device of claim 1, further comprising the first circuitry that comprises a readout circuitry.

3. The semiconductor device of claim 1, wherein the detection region is intrinsic.

4. The semiconductor device of claim 1, wherein a peak doping of the first doped region and a peak doping of the second doped region is between $1\times10^{19}$ $cm^{-3}$ to $5\times10^{21}$ $cm^{-3}$.

5. The semiconductor device of claim 4, wherein a peak doping of the counter-doped region is between $5\times10^{18}$ $cm^{-3}$ and $5\times10^{20}$ $cm^{-3}$.

6. The semiconductor device of claim 1, wherein the semiconductor device is an image sensor.

7. The semiconductor device of claim 6, wherein the image sensor is configured to operate at a frame rate not more than 1000 frames per second (fps).

* * * * *